US010775419B2

(12) United States Patent
Dummermuth

(10) Patent No.: US 10,775,419 B2
(45) Date of Patent: Sep. 15, 2020

(54) THRU-LINE DIRECTIONAL POWER SENSOR HAVING MICROSTRIP COUPLER

(71) Applicant: BIRD TECHNOLOGIES GROUP INC, Solon, OH (US)

(72) Inventor: Martin E. Dummermuth, Chagrin Falls, OH (US)

(73) Assignee: BIRD TECHNOLOGIES GROUP INC., Solon, OH (US)

( * ) Notice: Subject to any disclaimer, the term of this patent is extended or adjusted under 35 U.S.C. 154(b) by 0 days.

(21) Appl. No.: 15/570,071

(22) PCT Filed: Apr. 28, 2016

(86) PCT No.: PCT/US2016/029897
§ 371 (c)(1),
(2) Date: Oct. 27, 2017

(87) PCT Pub. No.: WO2016/176516
PCT Pub. Date: Nov. 3, 2016

(65) Prior Publication Data
US 2018/0106838 A1    Apr. 19, 2018

Related U.S. Application Data

(60) Provisional application No. 62/154,105, filed on Apr. 28, 2015.

(51) Int. Cl.
*G01R 21/10*        (2006.01)
*G01R 15/14*        (2006.01)
(Continued)

(52) U.S. Cl.
CPC ........... *G01R 15/146* (2013.01); *G01R 21/10* (2013.01); *H01P 5/184* (2013.01); *H01P 5/185* (2013.01);
(Continued)

(58) Field of Classification Search
CPC ....... G01R 15/146; G01R 21/10; H01P 5/184; H01P 5/185; H03H 7/24; H05K 1/0243; H05K 2201/10015
(Continued)

(56) References Cited

U.S. PATENT DOCUMENTS 4,211,911 A    7/1980 Dehn
4,701,724 A    10/1987 Martin
(Continued)

FOREIGN PATENT DOCUMENTS

CA    2983938    11/2016
EP    2822091    1/2015
(Continued)

OTHER PUBLICATIONS

Espacenet Translation JP2013183351A (Year: 2019).*
(Continued)

*Primary Examiner* — Farhana A Hoque
*Assistant Examiner* — Courtney G McDonnough
(74) *Attorney, Agent, or Firm* — Wegman Hessler

(57) ABSTRACT

Disclosed is a directional coupler having a coupler, a forward resistive attenuator, a reflected resistive attenuator, a forward compensation capacitor, and a reflected compensation capacitor. A forward coupler side arm and reflected coupler side arm of the coupler are configured to obtain a sample of forward energy and a sample of reflected energy from the coupler transmission line section. The forward resistive attenuator and reflected resistive attenuator are configured to attenuate the sample of forward energy and the sample of reflected energy. The forward compensation capacitor and the reflected compensation capacitor are configured to receive the attenuated sample of forward energy and the attenuated sample of reflected energy and produce a (Continued)

frequency-compensated sample of forward energy and a frequency-compensated sample of reflected energy.

18 Claims, 27 Drawing Sheets

(51) Int. Cl.
  *H01P 5/18* (2006.01)
  *H03H 7/24* (2006.01)
  *H05K 1/02* (2006.01)
(52) U.S. Cl.
  CPC ............ *H03H 7/24* (2013.01); *H05K 1/0243* (2013.01); *H05K 2201/10015* (2013.01)
(58) Field of Classification Search
  USPC .................................................. 324/95, 702
  See application file for complete search history.

(56) References Cited

U.S. PATENT DOCUMENTS

| | | | |
|---|---|---|---|
| 5,629,653 A | 5/1997 | Stimson | |
| 6,066,994 A | 5/2000 | Shepherd | |
| 6,972,638 B2 | 12/2005 | Usami | |
| 7,576,626 B2 | 8/2009 | Gorbachov | |
| 7,907,032 B2 | 3/2011 | Yamamoto | |
| 8,289,102 B2 | 10/2012 | Yamamoto | |
| 8,558,640 B2 | 10/2013 | Hirai | |
| 9,276,552 B2 | 3/2016 | Jones | |
| 2005/0077980 A1* | 4/2005 | Watanabe | H01P 1/15 333/126 |
| 2006/0044075 A1* | 3/2006 | Storniolo | H01P 5/185 333/116 |
| 2006/0273869 A1* | 12/2006 | Jachowski | H01P 1/2039 333/204 |
| 2008/0197938 A1* | 8/2008 | Hussain | H01P 5/185 333/116 |
| 2008/0224690 A1 | 9/2008 | Nicholson | |
| 2011/0119001 A1* | 5/2011 | Holt | G01R 21/01 702/60 |
| 2012/0111598 A1 | 5/2012 | Pawluk | |
| 2013/0207741 A1 | 8/2013 | Presti | |
| 2016/0211928 A1* | 7/2016 | Brewer | H04B 17/103 |
| 2018/0106838 A1 | 4/2018 | Dummermuth | |

FOREIGN PATENT DOCUMENTS

| | | | | |
|---|---|---|---|---|
| FR | 2923950 | | 5/2009 | |
| JP | 2013183351 | | 9/2013 | |
| JP | 2013183351 A | * | 9/2013 | ............... H01P 5/18 |
| WO | 2012111598 | | 8/2012 | |

OTHER PUBLICATIONS

Gupta et al. "A Novel Miniaturized Wideband, High Directivity Microstrip Coupler on FR4" 2013, 4 pages long.
Kim et al. "A Design of Single and Multi-Section Microstrip Directional Coupler with the High Directivity" 2004, 4 pages long.
International Search Report and Written Opinion for International Application No. PCT/US2016/029897 dated Aug. 4, 2016.
International Preliminary Report on Patentability IPRP for corresponding international application No. PCT/US2016/029897, filed on Apr. 28, 2015, dated Nov. 9, 2017, 8 pages long.
European Communication pursuant to Rules 161(1) and 162 EPC for European Application No. 167213396, filed Nov. 24, 2017, dated Dec. 7, 2017, 3 pages long.
European Communication pursuant to Article 94(3) EPC for European Application No. 16721339.6, filed Nov. 24, 2017, dated Feb. 24, 2020, 3 pages long.

* cited by examiner

THRU-LINE DIRECTIONAL POWER SENSOR HAVING MICROSTRIP COUPLER

CROSS-REFERENCE TO RELATED APPLICATIONS

This application is the US National phase entry of International Patent Application No. PCT/US2016/029897 filed Apr. 28, 2016, which claims priority to U.S. Provisional Patent Application Ser. No. 62/154,105, filed Apr. 28, 2015, and titled THRU-LINE DIRECTIONAL POWER SENSOR HAVING MICROSTRIP COUPLER, all of the above listed applications are incorporated by reference herein.

FIELD OF THE INVENTION

This application is directed to radio frequency (RF) power measurement. More specifically, to a thru-line directional RF power sensor having a microstrip coupler.

BACKGROUND OF THE INVENTION

There are many applications within the radio communications industry, where it is desired to measure the power that is present within a transmission line structure. This increases the need for RF power sensors.

BRIEF SUMMARY OF THE INVENTION

According to one aspect of the present invention, a directional coupler is provided. The directional coupler has a coupler, a forward resistive attenuator, a reflected resistive attenuator, a forward compensation capacitor, and a reflected compensation capacitor. The coupler is comprised of a coupler transmission line section and a coupling structure. The coupling structure has a coupled line with a coupling length of $D_1$, the coupling structure also has a forward coupler side arm electrically connected to an upstream end of the coupled line, and a reflected coupler side arm electrically connected to a downstream end of the coupled line.

The coupled line is coupled to the coupler transmission line section. The forward coupler side arm is configured to obtain a sample of forward energy from the coupler transmission line section using the coupled line, and the reflected coupler side arm is configured to obtain a sample of reflected energy from the coupled transmission line section using the coupled line. The forward coupler side arm is electrically connected to the forward resistive attenuator and configured to provide the sample of forward energy to the forward resistive attenuator. The forward resistive attenuator is configured to attenuate the sample of forward energy, thereby producing an attenuated sample of forward energy, the forward resistive attenuator is electrically connected to the forward compensation capacitor and configured to provide the attenuated sample of forward energy to the forward compensation capacitor.

The forward compensation capacitor is configured to receive the attenuated sample of forward energy and produce a frequency-compensated sample of forward energy. The reflected coupler side arm is electrically connected to the reflected resistive attenuator and configured to provide the sample of reflected energy to the reflected resistive attenuator. The the reflected resistive attenuator is configured to attenuate the sample of reflected energy, thereby producing an attenuated sample of reflected energy, the reflected resistive attenuator is electrically connected to the reflected compensation capacitor and configured to provide the attenuated sample of reflected energy to the reflected compensation capacitor. The reflected compensation capacitor is configured to receive the attenuated sample of reflected energy and produce a frequency-compensated sample of reflected energy.

In another aspect of the invention, the directional coupler as set forth in claim 1, wherein the directional coupler is configured as a frequency-compensated shortline dual directional coupler In another aspect of the invention, the coupling length ($D_1$) of the coupled line is significantly less than $\lambda/4$, where $\lambda$ is a wavelength of an RF wave in the coupled line at a center frequency of the directional coupler.

In another aspect of the invention, the coupling length ($D_1$) of the coupled line is between about $\lambda/32$ and $\lambda/64$.

In another aspect of the invention, the coupling length ($D_1$) of the coupled line is about $\lambda/42$.

In another aspect of the invention, the coupling structure is a microstrip on a printed circuit board (PCB).

In another aspect of the invention, the coupler transmission line section can be a microstrip transmission line or a rigid air transmission line.

In another aspect of the invention, the forward compensation capacitor is configured as a shunt capacitor.

In another aspect of the invention, the forward compensation capacitor is configured as a feedthru shunt capacitor.

In another aspect of the invention, the forward compensation capacitor is configured as a capacitive divider having a series capacitor and a shunt capacitor.

In another aspect of the invention, the forward compensation capacitor is configured as a capacitive divider having a series capacitor and a feedthru shunt capacitor.

In another aspect of the invention, the forward compensation capacitor is configured as a capacitive divider having a first shunt capacitor and a series capacitor and a second shunt capacitor, wherein the second shunt capacitor is a feedthru shunt capacitor.

In another aspect of the invention, the forward compensation capacitor is configured as: a shunt, a shunt feedthru, a series—shunt, a series—shunt feedthru, or a shunt—series—shunt feedthru.

In another aspect of the invention, the reflected compensation capacitor is configured as a shunt capacitor.

In another aspect of the invention, the reflected compensation capacitor is configured as a feedthru shunt capacitor.

In another aspect of the invention, the reflected compensation capacitor is configured as a capacitive divider having a series capacitor and a shunt capacitor.

In another aspect of the invention, the reflected compensation capacitor is configured as a capacitive divider having a series capacitor and a feedthru shunt capacitor.

In another aspect of the invention, the reflected compensation capacitor is configured as: a shunt, a shunt feedthru, a series—shunt, a series—shunt feedthru, or a shunt—series—shunt feedthru.

In another aspect of the invention, the reflected compensation capacitor is configured as a capacitive divider having a first shunt capacitor and a series capacitor and a second shunt capacitor, wherein the second shunt capacitor is a feedthru shunt capacitor.

In another aspect of the invention, the forward resistive attenuator is comprised of a chip attenuator, and the reflected attenuator is comprised of a chip attenuator.

In another aspect of the invention, the forward resistive attenuator is comprised of a chip attenuator and a lumped attenuator, and the reflected attenuator is comprised of a chip attenuator and a lumped attenuator.

In another aspect of the invention, the forward compensation capacitor and the reflected compensation capacitor are configured to reduce the coupling of the coupled line to the coupler transmission line section, thereby flattening a frequency response of the directional coupler.

In another aspect of the invention, the forward compensation capacitor and the reflected compensation capacitor are further configured to reduce a level of the frequency-compensated sample of forward energy and a level of the frequency-compensated sample of reflected energy through voltage division and reduce an impedance seen by a forward square-law detector and a reflected square-law detector.

In another aspect of the invention, the forward resistive attenuator provides isolation between the forward compensation capacitor and the coupling structure, and the reflected resistive attenuator provides isolation between the reflected compensation capacitor and the coupling structure, thereby preventing the forward compensation capacitor and the reflected compensation capacitor from degrading a directivity of the coupler structure.

According to yet another aspect of the invention, a radio frequency (RF) power sensor is provided. The RF power sensor has a directional coupler and a power measurement circuit. The directional coupler is configured to sample energy on a main transmission line and provides a frequency-compensated sample of forward energy and a frequency-compensated sample of reflected energy to the power measurement circuit. The frequency-compensated sample of forward energy is a sample of energy travelling in the forward direction on the main transmission line, and the frequency-compensated sample of reflected energy is a sample of energy travelling in the reflected direction on the main transmission line. The power measurement circuit is configured to receive the frequency-compensated sample of forward energy and the frequency-compensated sample of reflected energy and output a corrected digitized forward power that is representative of the forward energy travelling on the main transmission line, and a corrected digitized reflected power which is representative of the reflected energy travelling on the main transmission line.

The directional coupler comprises a coupler, a forward resistive attenuator, a reflected resistive attenuator, a forward compensation capacitor, and a reflected compensation capacitor. The coupler is comprised of a coupler transmission line section and a coupling structure. The coupling structure has a coupled line with a coupling length of $D_1$, the coupling structure also has a forward coupler side arm electrically connected to an upstream end of the coupled line, and a reflected coupler side arm electrically connected to a downstream end of the coupled line. The coupled line is coupled to the coupler transmission line section. The forward coupler side arm is configured to obtain a sample of forward energy from the coupler transmission line section using the coupled line, and the reflected coupler side arm is configured to obtain a sample of reflected energy from the coupled transmission line section using the coupled line.

The forward coupler side arm is electrically connected to the forward resistive attenuator and configured to provide the sample of forward energy to the forward resistive attenuator. The forward resistive attenuator is configured to attenuate the sample of forward energy, thereby producing an attenuated sample of forward energy, the forward resistive attenuator is electrically connected to the forward compensation capacitor and configured to provide the attenuated sample of forward energy to the forward compensation capacitor.

The forward compensation capacitor is configured to receive the attenuated sample of forward energy and produce a frequency-compensated sample of forward energy. The reflected coupler side arm is electrically connected to the reflected resistive attenuator and configured to provide the sample of reflected energy to the reflected resistive attenuator. The reflected resistive attenuator is configured to attenuate the sample of reflected energy, thereby producing an attenuated sample of reflected energy, the reflected resistive attenuator is electrically connected to the reflected compensation capacitor and configured to provide the attenuated sample of reflected energy to the reflected compensation capacitor. The reflected compensation capacitor is configured to receive the attenuated sample of reflected energy and produce a frequency-compensated sample of reflected energy.

In another aspect of the invention, the directional coupler is configured as a frequency-compensated shortline dual directional coupler In another aspect of the invention, the coupling length ($D_1$) of the coupled line is significantly less than $\lambda/4$, where $\lambda$ is a wavelength of an RF wave in the coupled line at a center frequency of the directional coupler.

In another aspect of the invention, the coupling length ($D_1$) of the coupled line is between about $\lambda/32$ and $\lambda/64$.

In another aspect of the invention, the coupling length ($D_1$) of the coupled line is about $\lambda/42$.

In another aspect of the invention, the coupling structure is a microstrip on a printed circuit board (PCB).

In another aspect of the invention, the coupler transmission line section can be a microstrip transmission line or a rigid air transmission line.

In another aspect of the invention, the forward compensation capacitor is configured as a shunt capacitor.

In another aspect of the invention, the forward compensation capacitor is configured as a feedthru shunt capacitor.

In another aspect of the invention, the forward compensation capacitor is configured as a capacitive divider having a series capacitor and a shunt capacitor.

In another aspect of the invention, the forward compensation capacitor is configured as a capacitive divider having a series capacitor and a feedthru shunt capacitor.

In another aspect of the invention, the forward compensation capacitor is configured as a capacitive divider having a first shunt capacitor and a series capacitor and a second shunt capacitor, wherein the second shunt capacitor is a feedthru shunt capacitor.

In another aspect of the invention, the forward compensation capacitor is configured as: a shunt, a shunt feedthru, a series—shunt, a series—shunt feedthru, or a shunt—series—shunt feedthru.

In another aspect of the invention, the reflected compensation capacitor is configured as a shunt capacitor.

In another aspect of the invention, the reflected compensation capacitor is configured as a feedthru shunt capacitor.

In another aspect of the invention, the reflected compensation capacitor is configured as a capacitive divider having a series capacitor and a shunt capacitor.

In another aspect of the invention, the reflected compensation capacitor is configured as a capacitive divider having a series capacitor and a feedthru shunt capacitor.

In another aspect of the invention, the reflected compensation capacitor is configured as: a shunt, a shunt feedthru, a series—shunt, a series—shunt feedthru, or a shunt—series—shunt feedthru.

In another aspect of the invention, the reflected compensation capacitor is configured as a capacitive divider having a first shunt capacitor and a series capacitor and a second shunt capacitor, wherein the second shunt capacitor is a feedthru shunt capacitor.

In another aspect of the invention, the forward resistive attenuator is comprised of a chip attenuator, and the reflected attenuator is comprised of a chip attenuator.

In another aspect of the invention, the forward resistive attenuator is comprised of a chip attenuator and a lumped attenuator, and the reflected attenuator is comprised of a chip attenuator and a lumped attenuator.

In another aspect of the invention, the forward compensation capacitor and the reflected compensation capacitor are configured to reduce the coupling of the coupled line to the coupler transmission line section, thereby flattening a frequency response of the directional coupler.

In another aspect of the invention, the forward compensation capacitor and the reflected compensation capacitor are further configured to reduce a level of the frequency-compensated sample of forward energy and a level of the frequency-compensated sample of reflected energy through voltage division and reduce an impedance seen by a forward square-law detector and a reflected square-law detector.

In another aspect of the invention, the forward resistive attenuator provides isolation between the forward compensation capacitor and the coupling structure, and the reflected resistive attenuator provides isolation between the reflected compensation capacitor and the coupling structure, thereby preventing the forward compensation capacitor and the reflected compensation capacitor from degrading a directivity of the coupler structure.

Advantages of the present invention will become more apparent to those skilled in the art from the following description of the embodiments of the invention which have been shown and described by way of illustration. As will be realized, the invention is capable of other and different embodiments, and its details are capable of modification in various respects.

BRIEF DESCRIPTION OF SEVERAL VIEWS OF THE DRAWINGS

These and other features of the present invention, and their advantages, are illustrated specifically in embodiments of the invention now to be described, by way of example, with reference to the accompanying diagrammatic drawings, in which.

Figure 1:
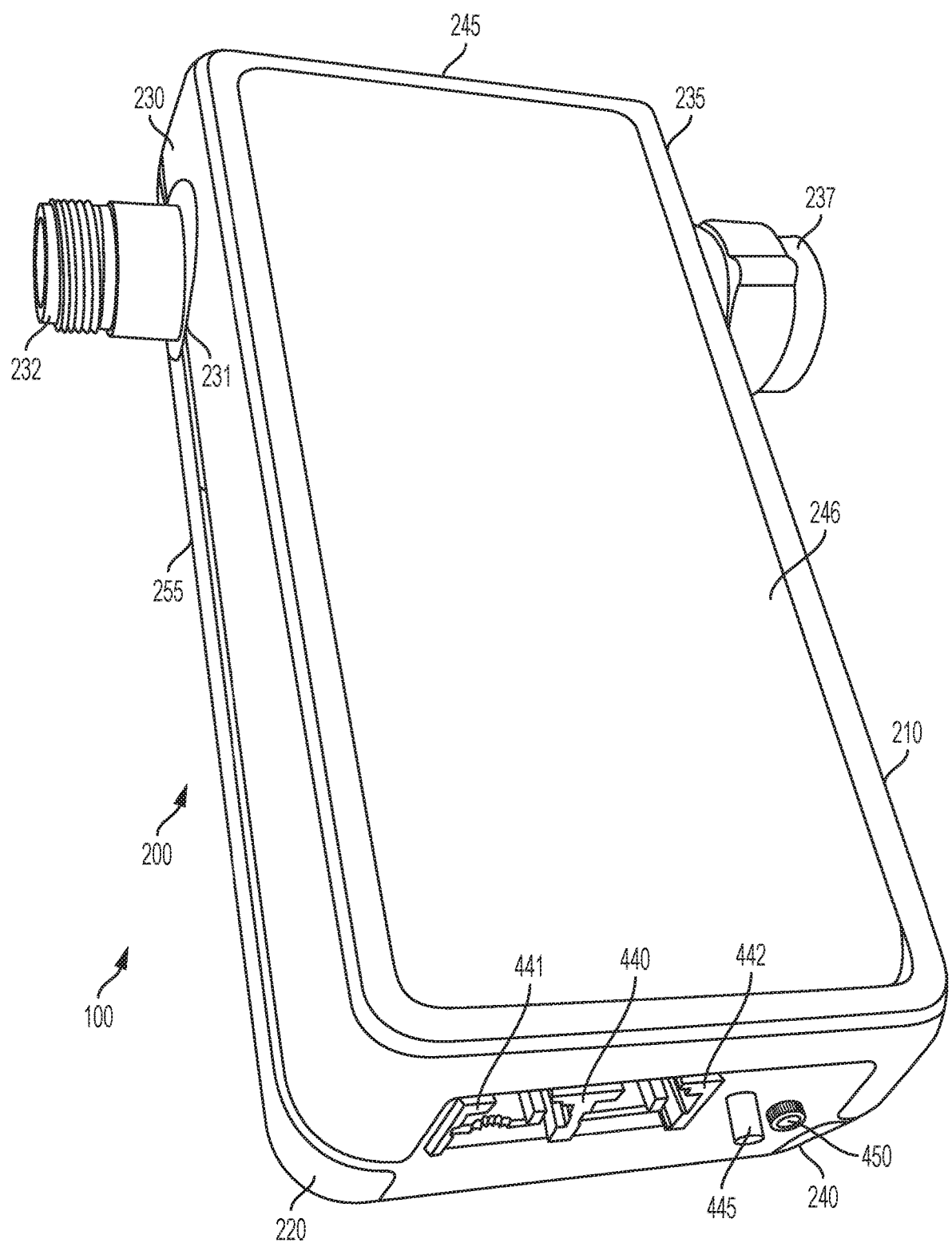
FIG. 1 is an isometric view of a radio frequency (RF) power sensor having a frequency compensated shortline dual directional coupler in accordance with an exemplary embodiment of the invention.
Figure 2:
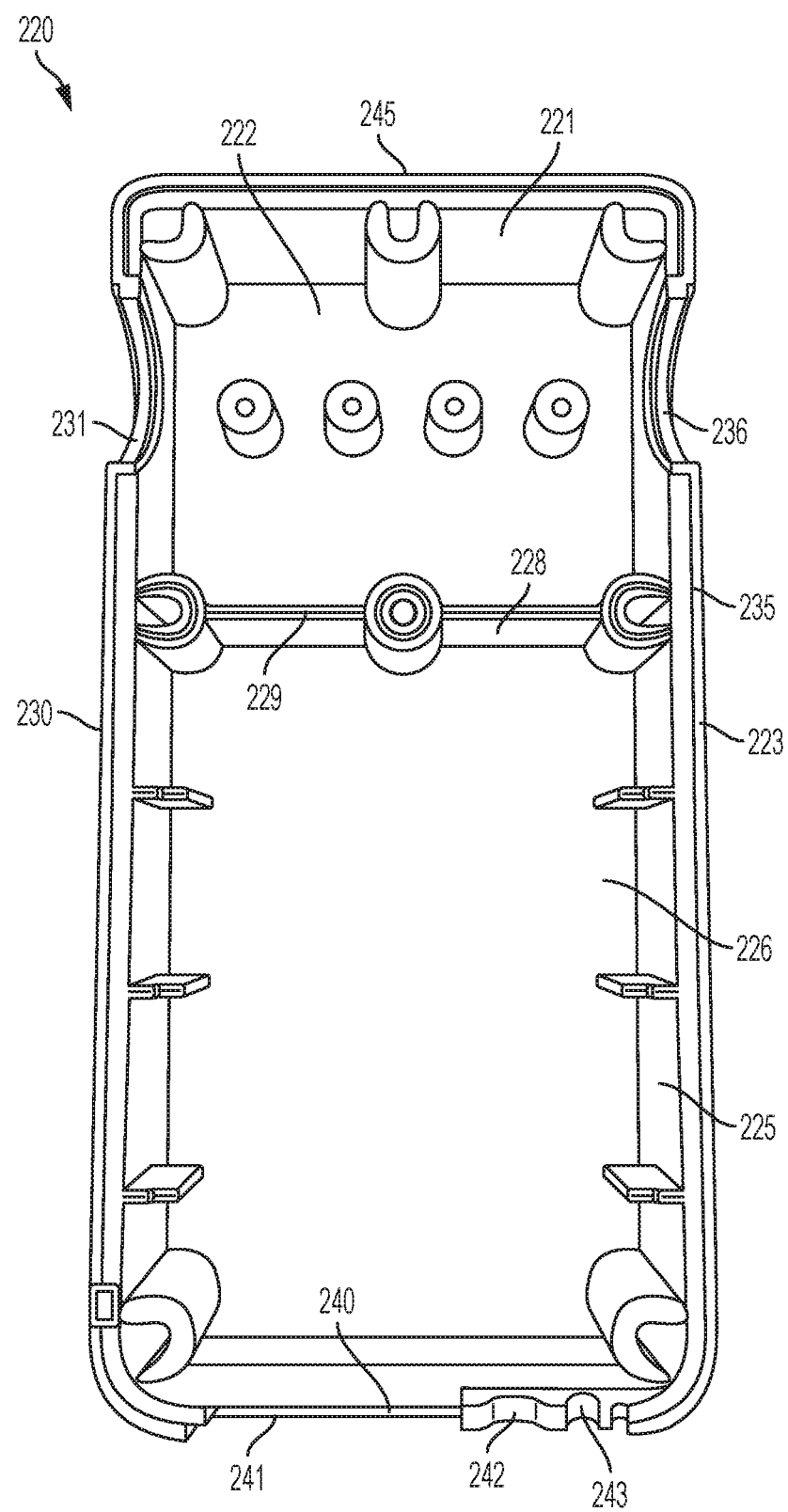
FIG. 2 is an overhead view of a lower portion of RF power sensor carrier body in accordance with an exemplary embodiment of the invention.
Figure 3:
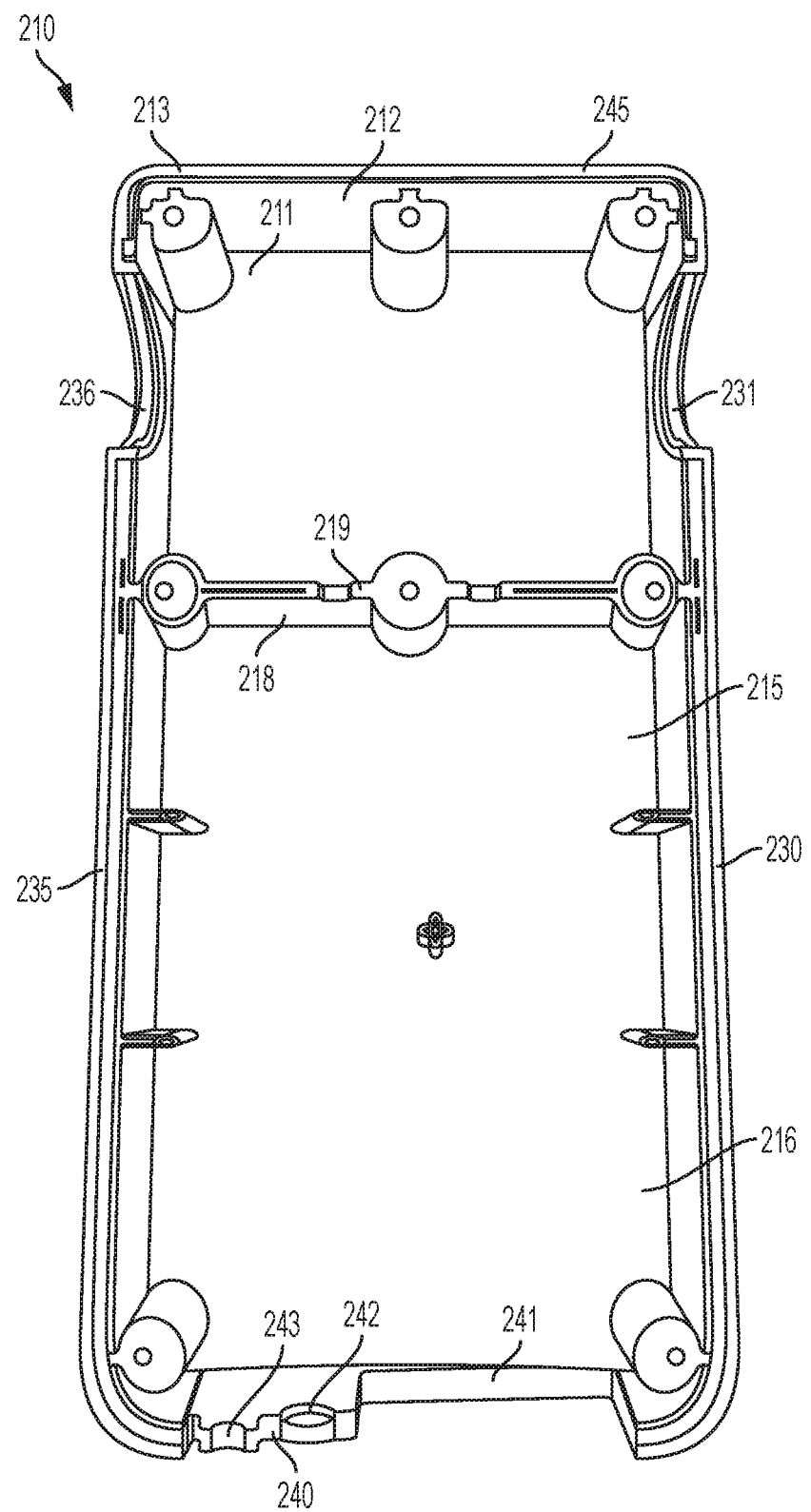
FIG. 3 is an overhead view of an upper portion of RF power sensor carrier body in accordance with an exemplary embodiment of the invention.
Figure 4:
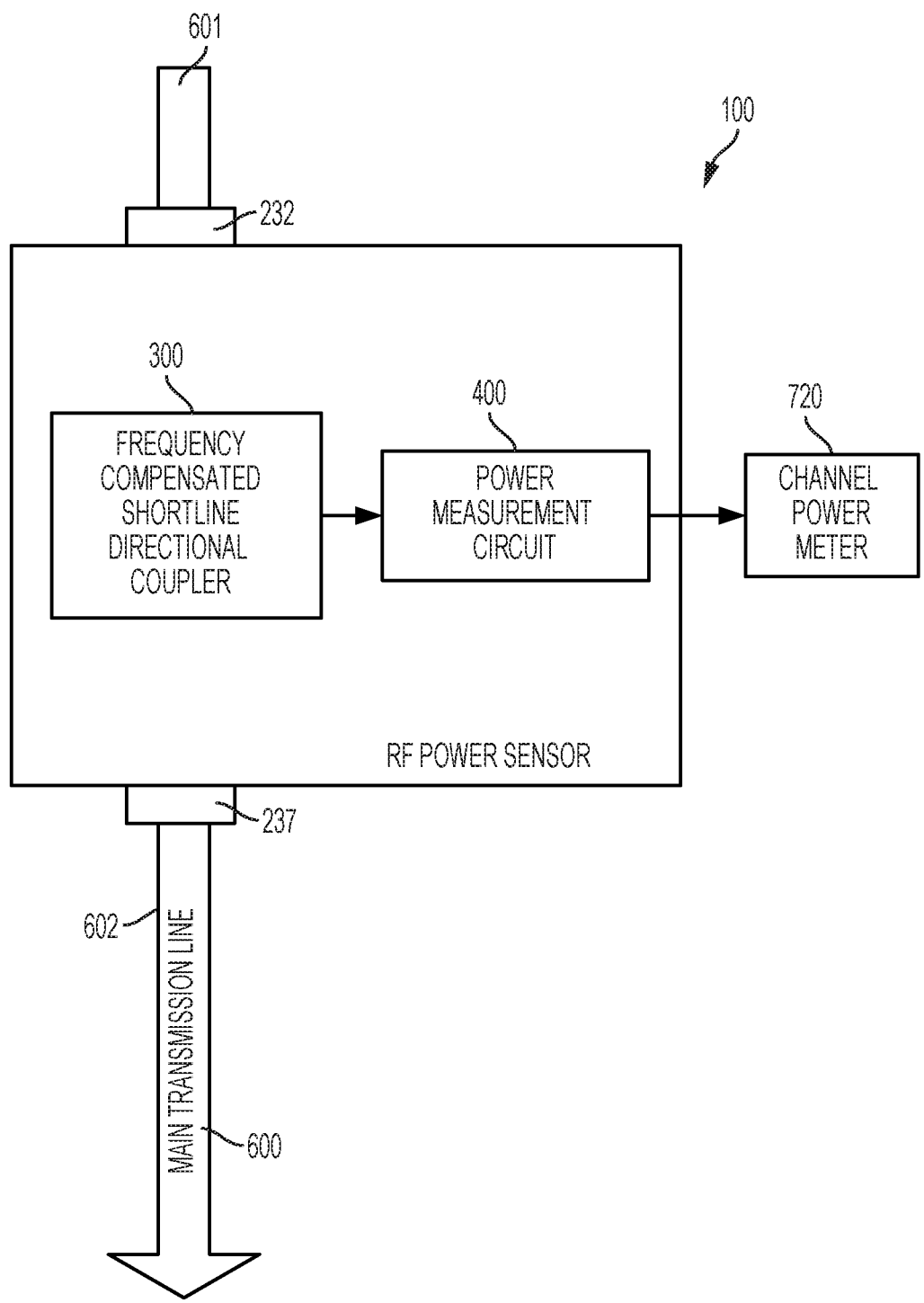
FIG. 4 is a block diagram of RF power sensor in accordance with an exemplary embodiment of the invention.
Figure 5:
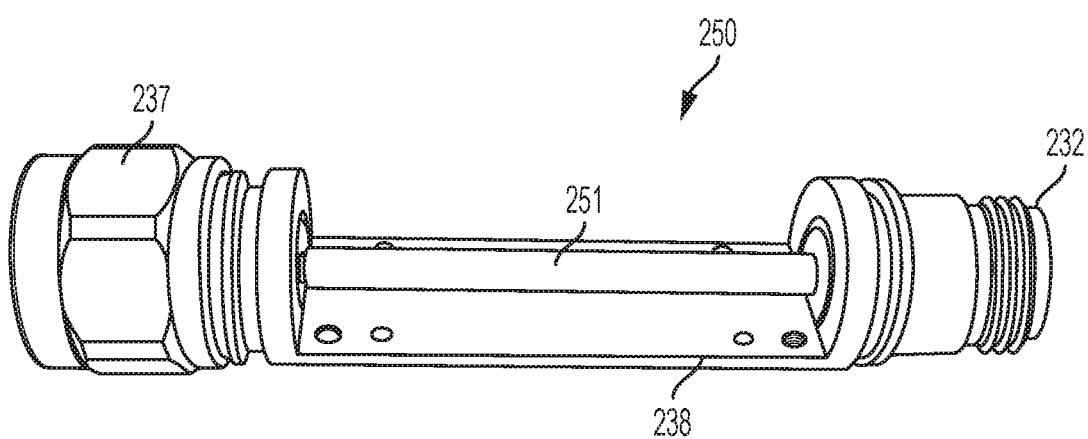
FIG. 5 is an isometric view of a transmission line assembly of RF power sensor in accordance with an exemplary embodiment of the invention.

It should be noted that all the drawings are diagrammatic and not drawn to scale. Relative dimensions and proportions of parts of these figures have been shown exaggerated or reduced in size for the sake of clarity and convenience in the drawings. The same reference numbers are generally used to refer to corresponding or similar features in the different embodiments. Accordingly, the drawing(s) and description are to be regarded as illustrative in nature and not as restrictive.

DETAILED DESCRIPTION OF THE PREFERRED EMBODIMENT

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In at least some instances, the approximating language may correspond to the precision of an instrument for measuring the value. Range limitations may be combined and/or interchanged, and such ranges are identified and include all the sub-ranges stated herein unless context or language indicates otherwise. Other than in the operating examples or where otherwise indicated, all numbers or expressions referring to quantities of ingredients, reaction conditions and the like, used in the specification and the claims, are to be understood as modified in all instances by the term "about".

"Optional" or "optionally" means that the subsequently described event or circumstance may or may not occur, or that the subsequently identified material may or may not be present, and that the description includes instances where the event or circumstance occurs or where the material is present, and instances where the event or circumstance does not occur or the material is not present.

As used herein, the terms "comprises", "comprising", "includes", "including", "has", "having", or any other variation thereof, are intended to cover a non-exclusive inclusion. For example, a process, method, article or apparatus that comprises a list of elements is not necessarily limited to only those elements, but may include other elements not expressly listed or inherent to such process, method, article, or apparatus.

The singular forms "a", "an", and "the" include plural referents unless the context clearly dictates otherwise.

A "processor", as used herein, processes signals and performs general computing and arithmetic functions. Signals processed by the processor can include digital signals, data signals, computer instructions, processor instructions, messages, a bit, a bit stream, or other means that can be received, transmitted and/or detected. Generally, the processor can be a variety of various processors including multiple single and multicore processors and co-processors and other multiple single and multicore processor and co-processor architectures. The processor can include various modules to execute various functions.

A "memory", as used herein can include volatile memory and/or nonvolatile memory. Non-volatile memory can include, for example, ROM (read only memory), PROM (programmable read only memory), EPROM (erasable PROM), and EEPROM (electrically erasable PROM). Volatile memory can include, for example, RAM (random access memory), synchronous RAM (SRAM), dynamic RAM (DRAM), synchronous DRAM (SDRAM), double data rate SDRAM (DDRSDRAM), and direct RAM bus RAM (DRRAM). The memory can also include a disk. The memory can store an operating system that controls or allocates resources of a computing device. The memory can also store data for use by the processor.

A "disk", as used herein can be, for example, a magnetic disk drive, a solid state disk drive, a floppy disk drive, a tape drive, a Zip drive, a flash memory card, and/or a memory stick. Furthermore, the disk can be a CD-ROM (compact disk ROM), a CD recordable drive (CD-R drive), a CD rewritable drive (CD-RW drive), and/or a digital video ROM drive (DVD ROM). The disk can store an operating system and/or program that controls or allocates resources of a computing device.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical non-transitory signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations or transformation of physical quantities or representations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device (such as a specific computing machine), that manipulates and transforms data represented as physical (electronic) quantities within the computer system memories or registers or other such information storage, transmission or display devices.

Certain aspects of the embodiments described herein include process steps and instructions described herein in the form of an algorithm. It should be noted that the process steps and instructions of the embodiments could be embodied in software, firmware or hardware, and when embodied in software, could be downloaded to reside on and be operated from different platforms used by a variety of operating systems. The embodiments can also be in a computer program product which can be executed on a computing system.

The embodiments also relates to an apparatus for performing the operations herein. This apparatus can be specially constructed for the purposes, e.g., a specific computer, or it can comprise a general-purpose computer selectively activated or reconfigured by a computer program stored in the computer. Such a computer program can be stored in a non-transitory computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each electrically connected to a computer system bus. Furthermore, the computers referred to in the specification can include a single processor or can be architectures employing multiple processor designs for increased computing capability.

The algorithms and displays presented herein are not inherently related to any particular computer or other apparatus. Various general-purpose systems can also be used with programs in accordance with the teachings herein, or it can prove convenient to construct more specialized apparatus to perform the method steps. The structure for a variety of these systems will appear from the description below. In addition, the embodiments are not described with reference to any particular programming language. It will be appreciated that a variety of programming languages can be used to implement the teachings of the embodiments as described herein, and any references below to specific languages are provided for disclosure of enablement and best mode of the embodiments.

In addition, the language used in the specification has been principally selected for readability and instructional purposes, and may not have been selected to delineate or circumscribe the inventive subject matter. Accordingly, the disclosure of the embodiments is intended to be illustrative, but not limiting, of the scope of the embodiments, which is set forth in the claims.

As was stated above, there are many applications within the radio communications industry, where it is desired to measure the RF power that is present within a transmission line structure. While there have been many approaches to this requirement used throughout the years, the ability to perform these measurements at low cost while maintaining high performance has always been a challenge. High-performance directional RF power sensors are difficult to design as low cost because of the challenge of achieving good directivity and flat frequency response over a wide bandwidth. In order to meet these performance requirements, a very good directional coupler is required. Traditionally, the best performing directional couplers are coaxial and based on air-filled transmission lines, which are relatively expensive to manufacture. Lower-cost directional couplers can be realized with planar technologies, namely stripline and microstrip, but both have traditionally had performance and manufacturing tradeoffs. For example, stripline is harder to manufacture than microstrip (and therefore more expensive). Further, stripline has challenges with getting signals from the top of the board to the inner layers. Stripline is also very difficult to prototype in the lab due to the fact that the stripline structure is constructed of properly and precisely laminated layers of dielectric and copper.

Microstrip is very popular for use in RF circuits due to its excellent manufacturability and compatibility with surface-mount components. Microstrip can also be easily prototyped in the lab, for quick evaluation and testing of designs. However, microstrip suffers from some performance issues. For example, since microstrip is a non-homogeneous medium, even and odd-mode phase velocities are different in microstrip, which leads to signal dispersion. This results in poor directivity and poor bandwidth in microstrip couplers. These problems make microstrip couplers less suitable for RF power sensors, where coupling flatness and high directivity over a wide bandwidth are desired.

Designers have attempted to overcome the microstrip performance issues in a number of ways. Common techniques for overcoming the different even and odd-mode phase velocities include placing capacitors (either lumped or printed) at the ends of the microstrip coupler. This technique works fairly well when a single 2\14 coupling section is used, but bandwidth is generally limited to less than an octave. To increase bandwidth, some designs have multiple 2\14 coupling sections placed in series; however the compensation of phase velocity becomes much more challenging across these multiple sections.

The RF power sensor 100 of FIG. 1 avoids these microstrip performance issues through a low-cost thru-line directional power sensor design based on a directional coupler 300 that is a microstrip, short-line, frequency compensated, and dual-directional. In one exemplary embodiment, the coupling length $D_1$ of coupled line 311 is about $\lambda/42$, which is much shorter than the typical $\lambda/4$ coupler, which results in a dramatic reduction in the problem with different even and odd-mode phase velocities and the resulting directivity is much improved. However, the tradeoff to the short-line microstrip directional coupler 300 is that the coupling is no longer flat, but increases with frequency at a rate of about 20 dB/decade. To overcome this problem, forward compensation capacitor 330 and reflected compensation capacitor 335, containing shunt capacitors, are added at the forward coupler side arm 312 and reflected coupler side arm 314 to reduce the coupling by about 20 dB/decade, resulting in a flat response. A forward resistive attenuator 320 is inserted between the forward coupler side arm 312 and forward compensation capacitor 330, and a reflected resistive attenuator 325 is inserted between the reflected compensation capacitor 335 and reflected coupler side arm 314, thus allowing the outputs to be well matched in order to maintain good directivity. The signal from the forward compensation capacitor 330 is then presented to the forward square-law detector 410 and the signal from the reflected compensation capacitor 335 is then presented to the reflected square-law detector 415 for power measurement.

The disclosed short-line microstrip coupler 300 avoids common problems with 214 microstrip couplers. The resulting directivity is near about 30 dB, but coupling increases between about 100-1000 MHz from about −44 dB to about −24 dB. The increasing coupling is compensated with shunt capacitance, in the form of forward compensation capacitor 330 and reflected compensation capacitor 335, isolated from the coupler with an attenuator, in the form of forward resistive attenuator 320 and reflected resistive attenuator 325. In one embodiment, the shunt capacitance of forward compensation capacitor 330 and reflected compensation capacitor 335 can be about 20 pF and the attenuator can be about a 30 db attenuator. In some embodiments, forward compensation capacitor 330 and reflected compensation capacitor 335 can take the form of a capacitive divider. The capacitive divider can be comprised of a 22 pF series capacitor and a 220 pF shunt feed-thru capacitor. In some embodiments, this can further reduce the signal level to achieve an overall coupling of about −83 dB that is flat from about 100 MHz to about 1000 MHz. The capacitive divider can also reduce the driving impedance to the forward square-law detector 410 and reflected square-law detector 415 to about 0.5 Ohms, which is ideal for getting the best temperature performance out of the forward square-law detector 410 and reflected square-law detector 415. The feed-thru capacitor can also allow the square-law detectors to be shielded in a metal can, thereby providing better isolation between the main transmission line 600 and the diode detectors (forward square-law detector 410 and reflected square-law detector 415).

The disclosed design of the directional RF power sensor 100 allows for the replacement of the expensive machined transmission line section, which is common in directional power sensors, with a low-cost microstrip coupler 305. The microstrip coupler 305 may be fabricated on an industry standard substrate, such as FR-4. The microstrip coupler 305 and associated circuitry can be assembled into a carrier body 200 to create a thru-line directional power sensor. The result is a smaller and less expensive directional power sensor with similar performance to the more expensive traditional design. In an exemplary embodiment, the full scale forward power handling of RF power sensor 100 is 500 W forward and 50 W reflected.

Turning to FIGS. 1-9, RF power sensor 100 has a carrier body 200 that contains a frequency compensated shortline directional coupler 300, a power measurement circuit 400, a printed circuit board (PCB) 500, and a transmission line assembly. In one exemplary embodiment, carrier body 200 is plastic and rectangular in shape. Carrier body 200 has an upper portion 210, lower portion 220, left side 230, right side 235, bottom 240, top 245, front 246, and back 255. Left side 230 is spaced apart from and located opposite right side 235. Front 246 and back 255 are spaced apart and located opposite each other, and span between left side 230, right side 235, top 245 and bottom 240. Bottom 240 and top 245 are spaced apart and located opposite each other, and span between front 246, back 255, left side 230, and right side 235.

Left side 230 has an upstream connector aperture 231, through which upstream connector 232 passes. Right side 235 has a downstream connector aperture 236, through which downstream connector 237 passes. Upstream connector 232 is electrically connectable to an upstream end 601 of main transmission line 600. Downstream connector 237 is electrically connectable to a downstream end 602 of main transmission line 600. Bottom 240 has a port aperture 241 and a reset switch aperture 242. Port aperture 241 provides access to port 440, reset switch aperture 242 provides access to reset switch 445, and LED aperture 243 provides access to LED 450. Port 440 can include a first port 441 and a second port 442. In an exemplary embodiment, port 440 is an RS-485 interface, wherein first port 441 and second port 442 permit the daisy chaining of multiple RF power sensors 100.

The upper portion 210 has an upper portion forward cavity 211 with an upper portion forward cavity surface 212, and an upper portion rear cavity 215 with an upper portion rear cavity surface 216. In one exemplary embodiment, upper portion forward cavity surface 212 and upper portion rear cavity surface 216 have a metallic coating. An upper portion dividing wall 218 divides the upper portion forward cavity 211 from the upper portion rear cavity 215. The upper portion dividing wall 218 runs from the left side 230 to the right side 235, parallel to the front 246. The upper portion dividing wall 218 has a base 219.

The lower portion 220 has a lower portion forward cavity 221 with a lower portion forward cavity surface 222, and a lower portion rear cavity 225 with a lower portion rear cavity surface 226. In one exemplary embodiment, lower portion forward cavity surface 222 and lower portion rear cavity surface 226 have a metallic coating. A lower portion dividing wall 228 divides the lower portion forward cavity 221 from the lower portion rear cavity 225. The lower portion dividing wall 228 runs from the left side 230 to the right side 235, parallel to the front 246. The lower portion dividing wall 228 has a base 229.

A first side 213 of the upper portion 210 contacts a first side 223 of the lower portion 220, when the upper portion 210 and the lower portion 220 are assembled to form the carrier body 200.

Figure 6:
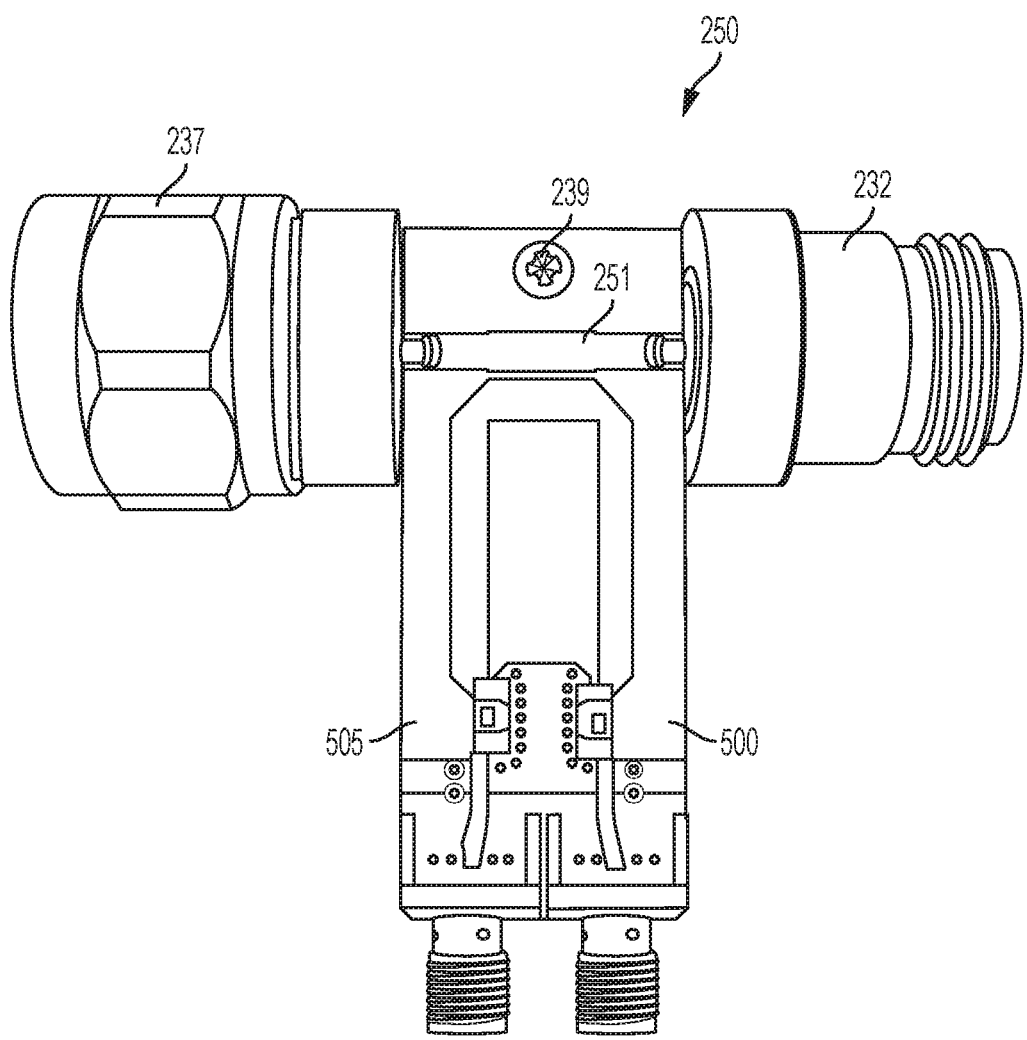
FIG. 6 is an overhead view of a transmission line assembly and coupler of RF power sensor in accordance with an exemplary embodiment of the invention.
Figure 7:
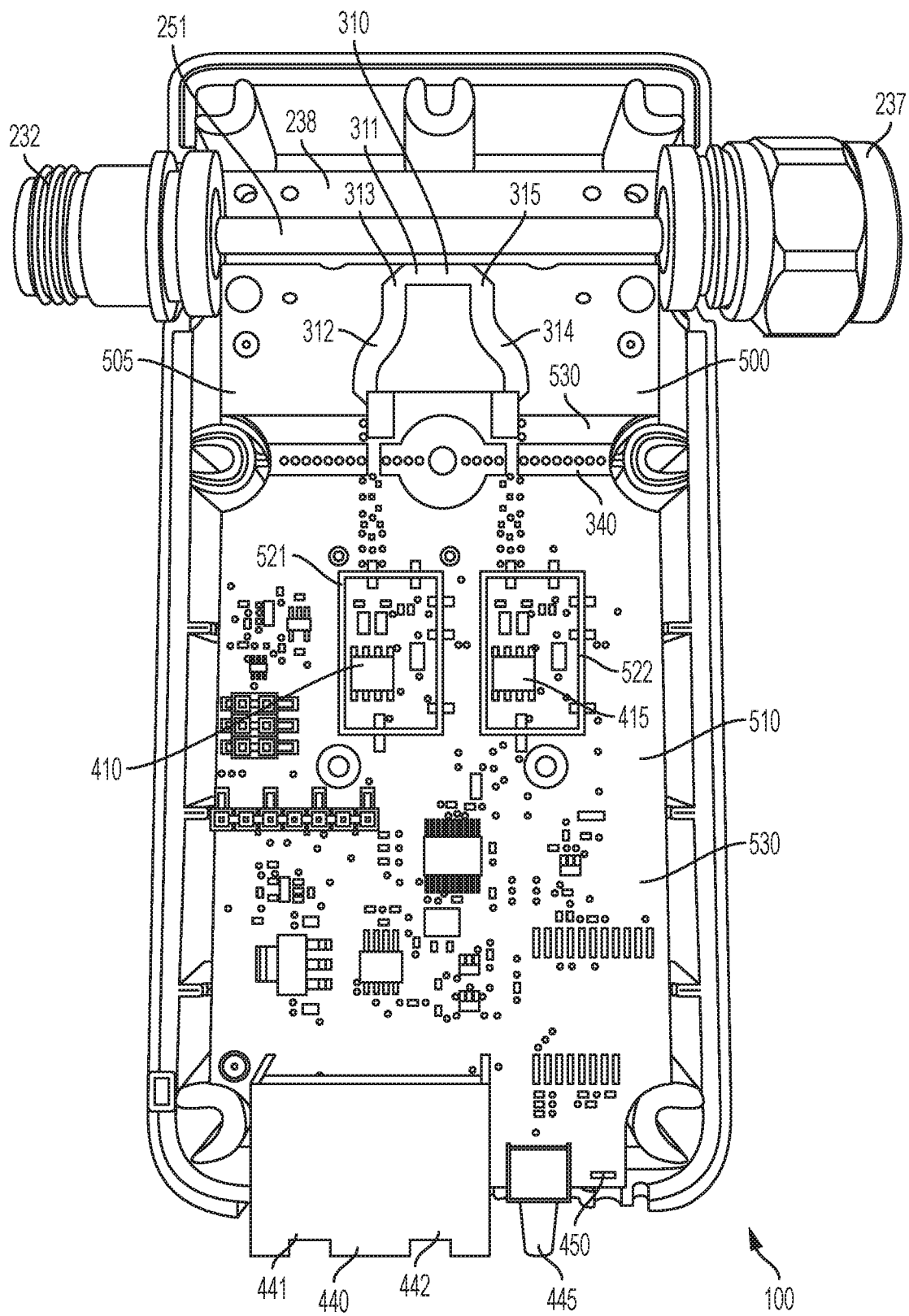
FIG. 7 is an overhead view of RF power sensor with upper portion of carrier body removed in accordance with an exemplary embodiment of the invention.
Figure 8:
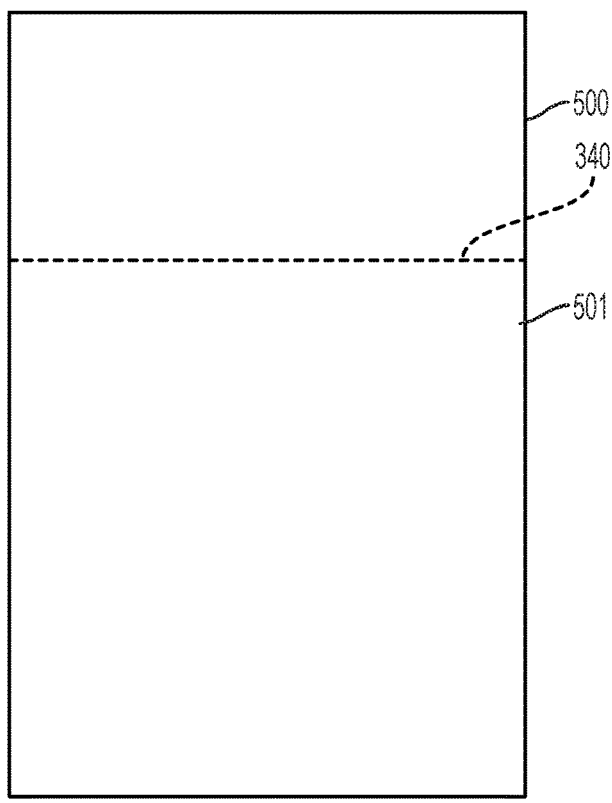
FIG. 8 is an overhead view of the topside of the printed circuit board of RF power sensor in accordance with an exemplary embodiment of the invention.
Figure 9:
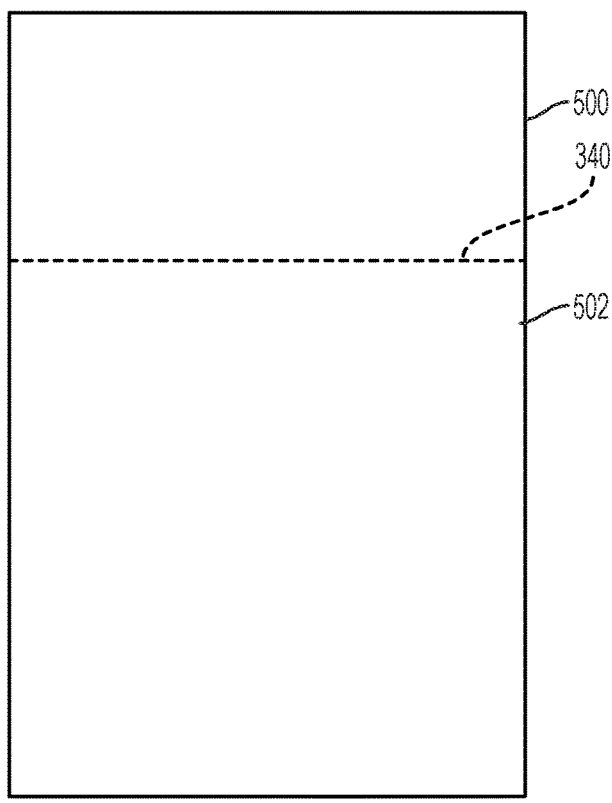
FIG. 9 is an overhead view of the bottom side of the printed circuit board of RF power sensor in accordance with an exemplary embodiment of the invention.
Figure 10:
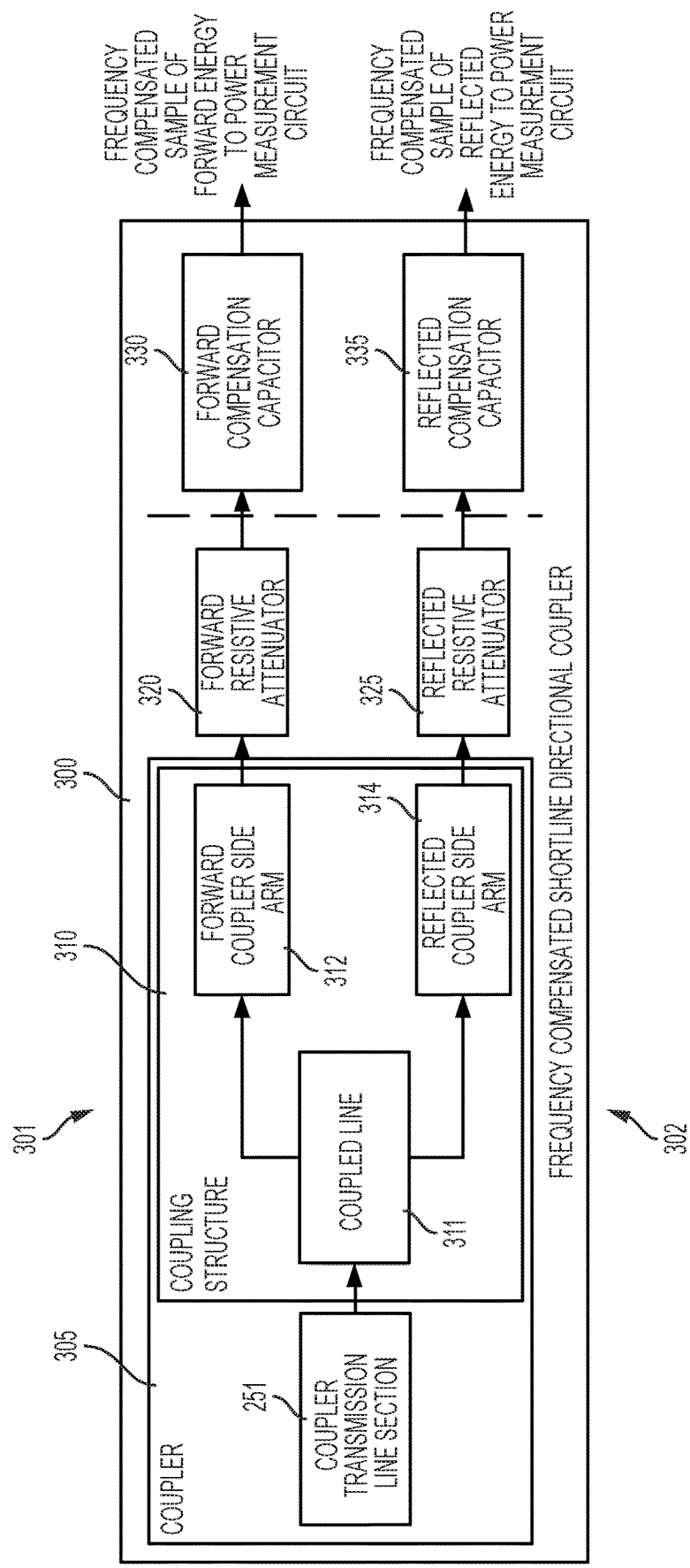
FIG. 10 is a block diagram of a frequency compensated shortline directional coupler of RF power sensor in accordance with an exemplary embodiment of the invention.

Transmission line assembly 250 includes upstream connector 232, downstream connector 237, coupler transmission line section 251, and outer conductor 238. Upstream connector 232 and downstream connector 237 are mounted on outer conductor 238. Upstream connector 232 and downstream connector 237 are electrically connected to coupler transmission line section 251. More specifically, upstream connector 232 is electrically connected to upstream section 252 of coupler transmission line section 251, and downstream connector 237 is electrically connected to downstream section 253 of coupler transmission line section 251. Outer conductor 238 is connectable to the coupler section 505 of PCB 500 using fasteners. In an exemplary embodiment, coupler transmission line section 251 can be a microstrip transmission line, such as is shown in FIG. 6, or a rigid air transmission line, such as is shown in FIG. 7. In an exemplary embodiment, the RF voltage on coupler transmission line section 251 can be 158 Vrms at maximum forward power and 50 Vrms at maximum reflected power.

Forward square-law detector 410 and reflected square-law detector 415 are very sensitive to stray energy. Accordingly, energy from coupler transmission line section 251 entering the rear cavity could potentially result in erroneous output from forward square-law detector 410 and reflected square-law detector 415. Accordingly, some embodiments of RF power sensor 100 include measures to reduce the amount of energy from coupler transmission line section 251 that can migrate to the forward square-law detector 410 and reflected square-law detector 415.

In one exemplary embodiment, PCB 500 includes a via wall 340 that travels from a topside 501 of PCB 500 to a bottom side 502 of PCB 500. Via wall 340 works in conjunction with the upper portion dividing wall 218 and the lower portion dividing wall 228 to minimize the amount of energy travelling on coupler transmission line section 251 from entering the rear cavity formed by upper portion rear cavity 215 and lower portion rear cavity 225.

More specifically, via wall 340 travels through PCB 500 and has a copper trace on the topside 501 of PCB 500 and on the bottom side 502 of PCB 500. Via wall 340 on the topside 501 contacts the base 219 of upper portion dividing wall 218, and via wall 340 on the bottom side 502 contacts the base 229 of the lower portion dividing wall 228. Therefore, since the upper portion dividing wall 218 and lower portion dividing wall 228 are both coated in a metallic finish, via wall 340, upper portion dividing wall 218, and lower portion dividing wall 228 form a metallic barrier between the coupler transmission line section 251 and the forward square-law detector 410 and reflected square-law detector 415. PCB 500 can be constructed out of any standard PCB material, such as FR-4, or higher-frequency printed circuit board materials offered by Rogers or Arlon.

Further, in some exemplary embodiments of RF power sensor 100, the metallic coating on the upper portion rear cavity surface 216 and lower portion rear cavity surface 226 also form a metallic barrier to help prevent energy around RF power sensor 100 from interfering with the operation of forward square-law detector 410 and reflected square-law detector 415.

In some exemplary embodiments of RF power sensor 100, a ground plane 530 can be placed on the topside 501 of PCB 500 to help prevent energy from surrounding circuitry and traces from interfering with the operation of forward square-law detector 410 and reflected square-law detector 415. In some exemplary embodiments, ground plane 530 is present on the detection section 510 of PCB 500 and absent on the coupler section 505 of PCB 500.

Further, in some exemplary embodiments of RF power sensor 100, a shield area 520 is placed around forward square-law detector 410 and reflected square-law detector 415 to help prevent energy from surrounding circuitry from interfering with the operation of forward square-law detector 410 and reflected square-law detector 415. In the exemplary embodiment shown in FIG. 6, shield area 520 is in the form of forward can 521 placed around forward square-law detector 410 and reflected can 522 placed around reflected square-law detector 415. In another exemplary embodiment, forward square-law detector 410 and reflected square-law detector 415 are located in the same can.

In some exemplary embodiments, coupler section 505 and detection section 510 are located on separate PCBs 500, and in other exemplary embodiments, coupler section 505 and detection section 510 are located on the same PCB 500. Further, coupler section 505 and detection section 510 are separated by via wall 340.

Figure 11:
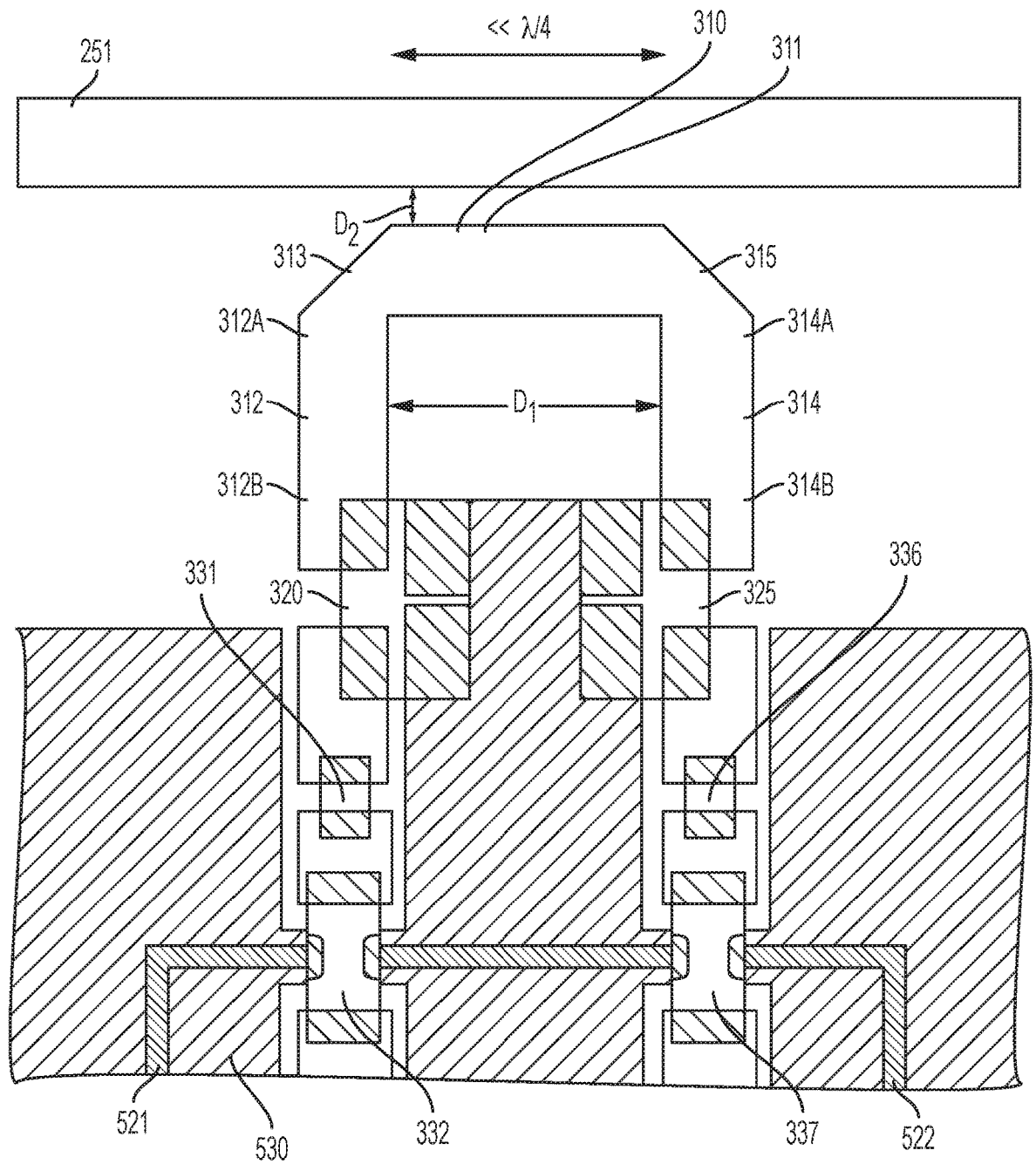
FIG. 11 is an overhead view of the frequency compensated shortline directional coupler section of printed circuit board of RF power sensor in accordance with an exemplary embodiment of the invention.
Figure 12:
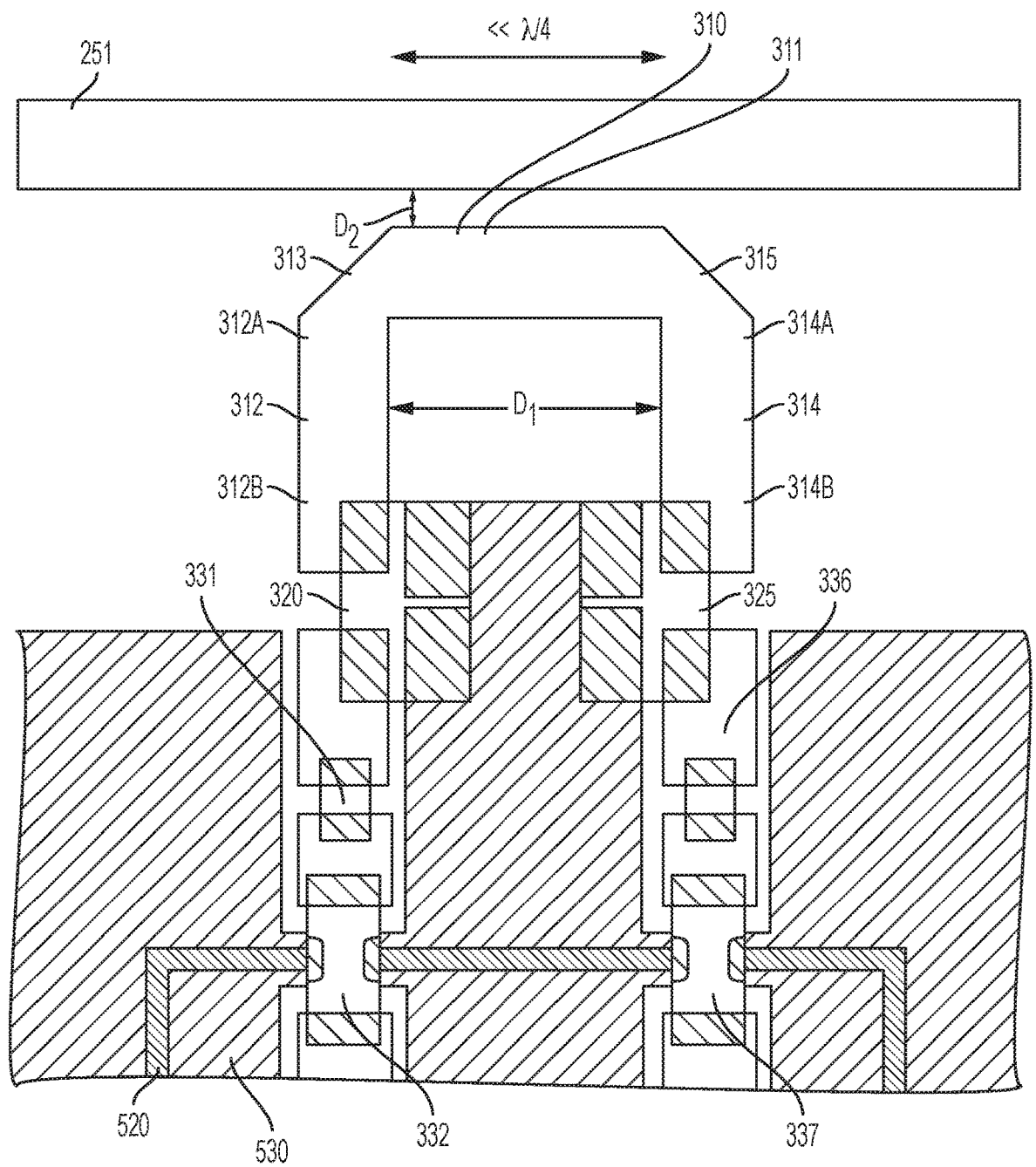
FIG. 12 is an overhead view of the frequency compensated shortline directional coupler section of printed circuit board of RF power sensor in accordance with an exemplary embodiment of the invention.

Turning to FIGS. 4 and 7-14, FIG. 10 is a block diagram and FIGS. 11-12 are a depiction of a section of PCB 500 containing a frequency compensated shortline directional coupler 300 of RF power sensor 100. Directional coupler 300 samples the energy on main transmission line 600 (RF voltage) and provides a frequency-compensated sample of energy travelling in the forward direction (sample of forward energy) and a frequency-compensated sample of energy travelling in the reflected direction (sample of reflected energy) to power measurement circuit 400. Power measurement circuit 400 receives the frequency-compensated sample of forward energy and the frequency-compensated sample of reflected energy from directional coupler 300 and produces an output which is representative of the forward energy travelling on main transmission line 600 and an output which is representative of the reflected energy travelling on main transmission line 600. More specifically, power measurement circuit 400 outputs a corrected digitized forward power which is representative of the forward energy travelling on main transmission line 600, and a corrected digitized reflected power which is representative of the reflected energy travelling on main transmission line 600.

Directional coupler 300 has a coupler 305, a forward resistive attenuator 320, reflected resistive attenuator 325, forward compensation capacitor 330, and reflected compensation capacitor 335. Coupler 305 is electrically connected to forward resistive attenuator 320 and reflected resistive attenuator 325. Forward resistive attenuator 320 is electrically connected to forward compensation capacitor 330. Reflected resistive attenuator 325 is electrically connected to reflected compensation capacitor 335.

Coupler 305, coupling structure 310, forward resistive attenuator 320, and reflected resistive attenuator 325 are located on an upstream side of via wall 340. Forward compensation capacitor 330 and reflected compensation capacitor 335 are located on a downstream side of via wall 340. Forward resistive attenuator 320 provides isolation between coupling structure 310 and forward compensation capacitor 330. Forward compensation capacitor 330 would harm the directivity of coupling structure 310, if forward resistive attenuator 320 did not isolate coupling structure from forward compensation capacitor. Reflected resistive attenuator 325 provides isolation between coupling structure 310 and reflected compensation capacitor 335. Reflected compensation capacitor 335 would harm the directivity of coupling structure 310, if reflected resistive attenuator 325 did not isolate coupling structure 310 from reflected compensation capacitor 335.

Directional coupler 300 is electrically connectable to the main transmission line 600 through upstream connector 232 and downstream connector 237. Directional coupler 300 is also electrically connected to the forward square-law detector 410 and reflected square-law detector 415. The forward compensation capacitor 330 is electrically connected to the forward square-law detector 410. The reflected compensation capacitor 335 is electrically connected to the reflected square-law detector 415.

Coupler 305 has coupler transmission line section 251 and coupling structure 310. Coupler transmission line section 251 is electrically connectable to coupling structure 310. Coupler transmission line section 251 is electrically connectable to the main transmission line 600 through upstream connector 232 and downstream connector 237. When coupler transmission line section 251 is electrically connected to the main transmission line 600, the energy flowing between the upstream end 601 and downstream end 602 of main transmission line 600 passes through coupler transmission line section 251 of coupler 305.

Coupler transmission line section 251 is configured to couple with coupling structure 310 through coupled line 311, when RF power is present on the coupler transmission line section 251. Coupler 305 is configured to obtain a sample of the energy on main transmission line 600 (RF Voltage) using coupling structure 310 and provide a sample of the energy travelling in the forward direction to forward resistive attenuator 320 and a sample of the energy travelling in the reflected direction to reflected resistive attenuator 325.

Coupling structure 310 has a coupled line 311, a forward coupler side arm 312, and a reflected coupler side arm 314. Coupled line 311 is electrically connected to forward coupler side arm 312 and coupled line 311 is electrically connected to reflected coupler side arm 314.

Figure 16A:
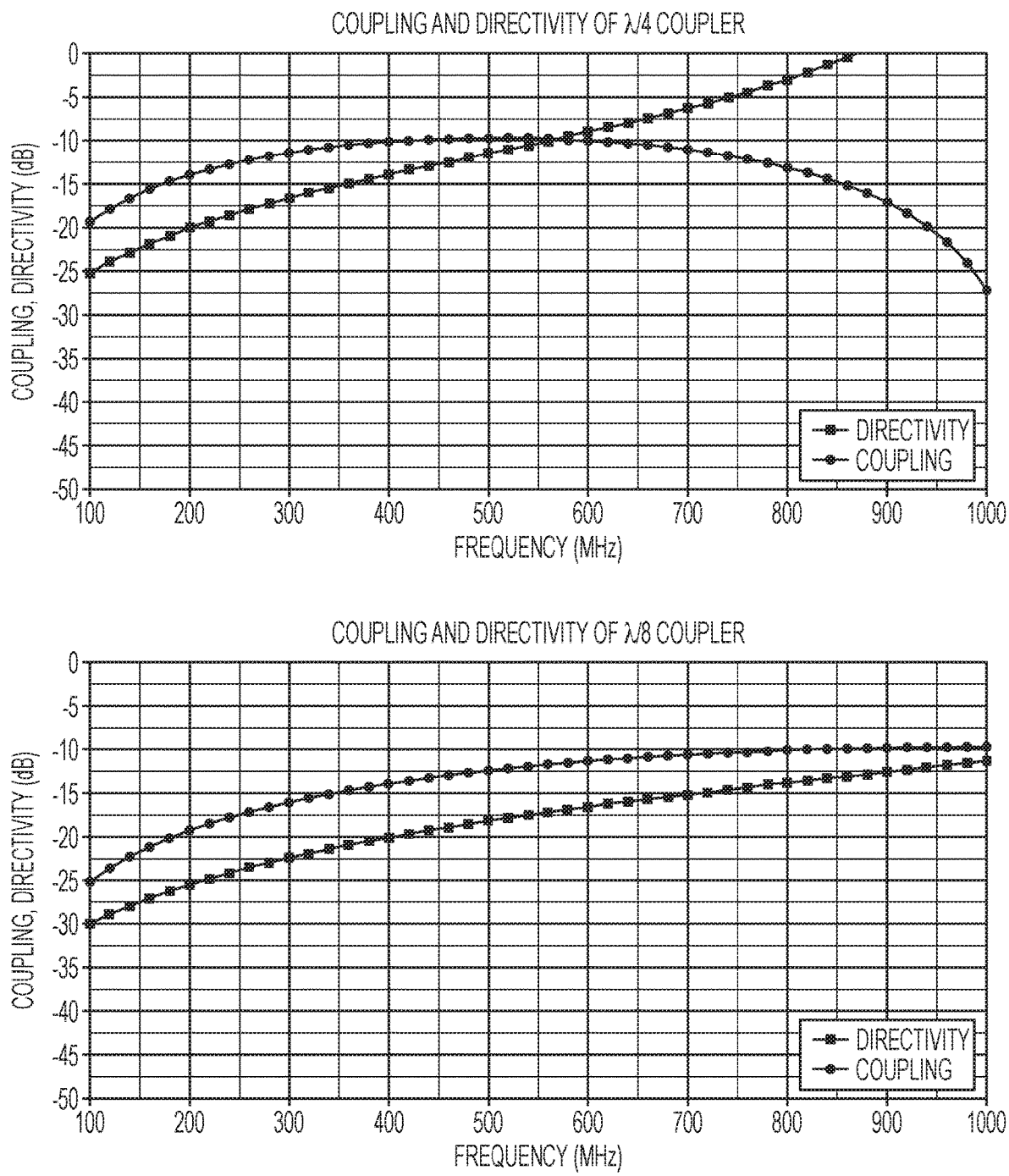
FIGS. 16A-C are graphs illustrating coupling and directivity of a coupling length of coupling line in accordance with an exemplary embodiment of the invention.
Figure 16B:
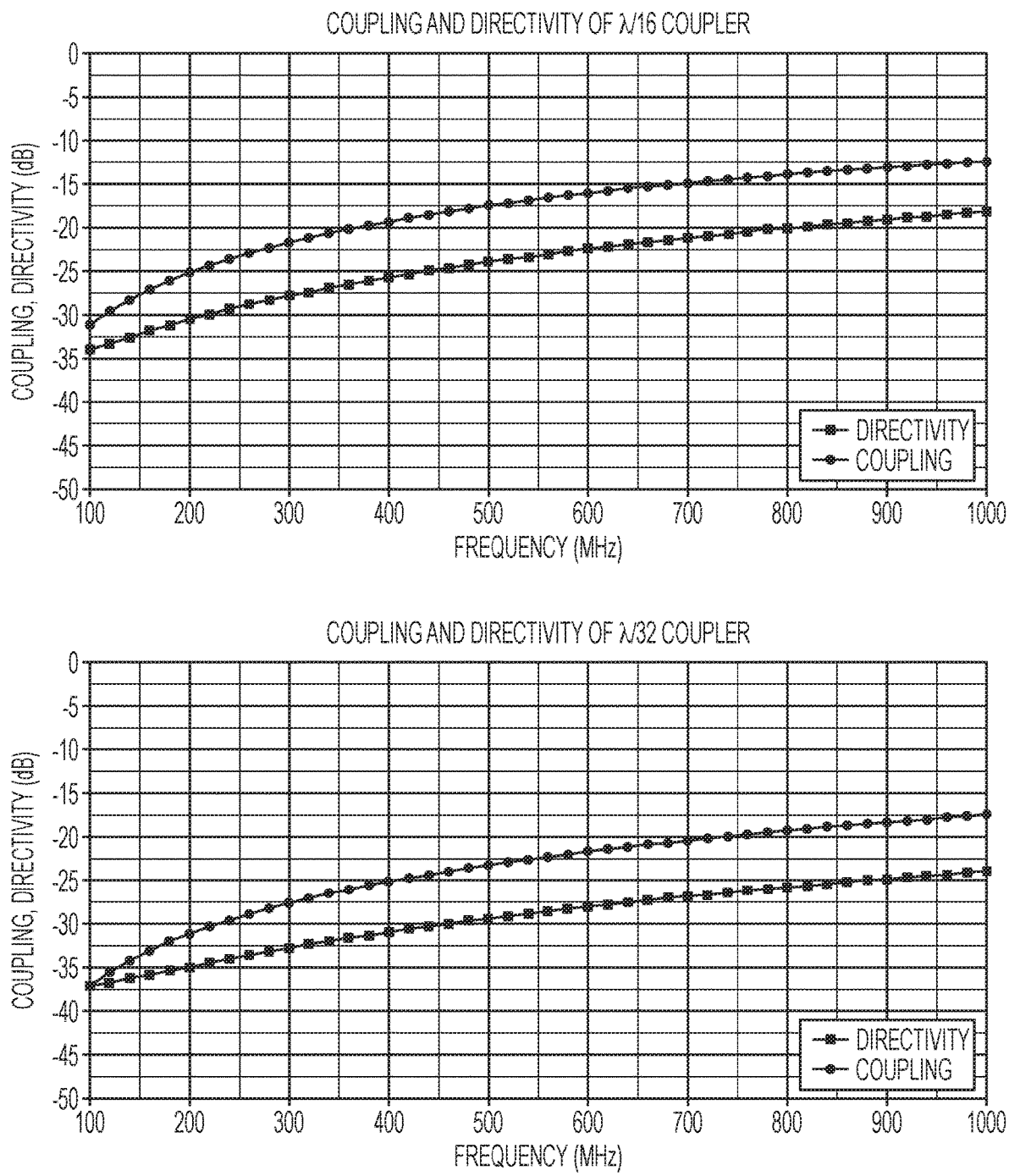
Figure 16C:
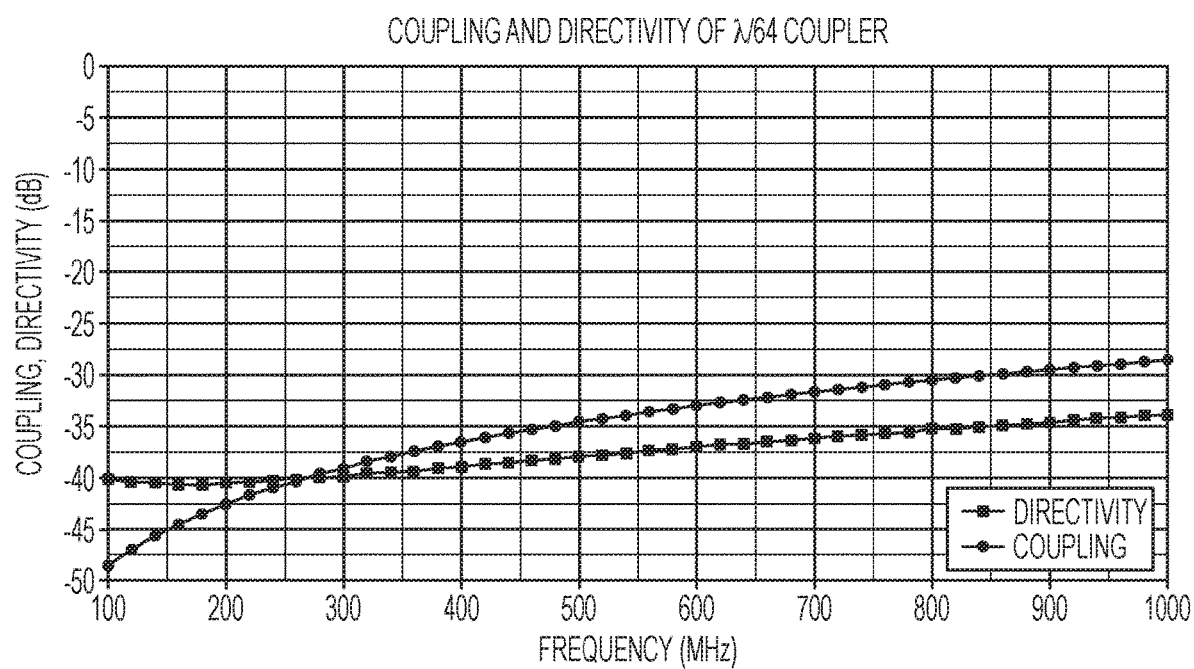

More specifically, coupled line 311 has an upstream end 313 and a downstream end 315. A first end 312A of forward coupler side arm 312 is electrically connected to the upstream end 313, and a second end 312B of forward coupler side arm 312 is electrically connected to forward resistive attenuator 320. A first end 314A of reflected coupler side arm 314 is electrically connected to the downstream end 315 of coupled line 311, and a second end 314B of reflected coupler side arm 314 is electrically connected to reflected resistive attenuator 325. The balance between coupling and directivity for a given coupling length $D_1$ of coupled line 311 is illustrated in FIGS. 16A-C. In an exemplary embodiment, the length of the coupled line 311, which is represented by the coupling length $D_1$ in FIGS. 11-12, is less than $\lambda/4$. In another exemplary embodiment, the coupling length of coupled line 311, $D_1$, is significantly less than $\lambda/4$. In further exemplary embodiment, the coupling length of coupled line 311, $D_1$, can be between about $\lambda/32$ and $\lambda/64$. In another exemplary embodiment, the coupling length of coupled line 311, $D_1$, can be about $\lambda/42$.

$\lambda$ is the wavelength of the RF wave in the coupled line 311 at the center frequency of directional coupler 300 of RF power sensor 100. In an exemplary embodiment, $\lambda$ can be the wavelength in the coupled line 311 of directional coupler 300 around 500 MHz (halfway between 100-1000 MHz).

Further, coupler transmission line section 251 runs parallel to coupled line 311. Coupler transmission line section 251 and coupled line 311 are separated by a distance $D_2$. In an exemplary embodiment, distance $D_2$ between coupler transmission line section 251 and coupled line 311 can be between about 0.005 inches to about 0.015 inches. In another exemplary embodiment, distance $D_2$ between coupler transmission line section 251 and coupled line 311 can be about 0.010 inches. In another exemplary embodiment distance $D_2$ between coupler transmission line section 251 and coupled line 311 is selected such that the even-mode and odd-mode impedances are balanced, resulting in cancellation of the reflected wave on the forward coupler side arm 312 and cancellation of the forward wave on the reflected coupler side arm 314.

Coupled line 311 is configured to couple with coupler transmission line 251, when RF power is present on the coupler transmission line section 251, obtain a sample of the energy on main transmission line 600 (RF Voltage), provide the sample of energy travelling in the forward direction on main transmission line 600 to the forward coupler side arm 312, and provide the sample of energy travelling in the reflected direction on main transmission line 600 to the reflected coupler side arm.

The forward coupler side arm 312 is electrically connected to the forward resistive attenuator 320. The forward coupler side arm 312 is configured to provide the sample of energy travelling in the forward direction to the forward resistive attenuator 320. Accordingly, forward coupler side arm 312 is configured to receive the sample of energy travelling in the forward direction on main transmission line 600 from coupled line 311, and provide to forward resistive attenuator 320 the sample of energy travelling in the forward direction on main transmission line 600 (sample of forward energy). In one exemplary embodiment, the sample of energy travelling in the forward direction of main transmission line can, at maximum full scale power, have a voltage between 1 Vrms to 10 Vrms, from 100 MHz to 1000 MHz, and an attenuation of −44 dB to −24 dB, from 100 MHz to 1000 MHz.

The reflected coupler side arm 314 is electrically connected to the reflected resistive attenuator 325. The reflected coupler side arm 314 is configured to provide the sample of energy travelling in the reflected direction on main transmission line 600 to the reflected resistive attenuator 325. Accordingly, reflected coupler side arm 314 is configured to receive the sample of energy travelling in the reflected direction on main transmission line 600 from coupled line 311, and provide to reflected resistive attenuator 325 the sample of energy travelling in the reflected direction on main transmission line 600 (sample of reflected energy). In one exemplary embodiment, the sample of energy travelling in the reflected direction of main transmission line can, at maximum full scale power, have a voltage between 320 mVrms to 3.2 Vrms, from 100 MHz to 1000 MHz, and an attenuation of −44 dB to −24 dB, from 100 MHz to 1000 MHz.

Forward resistive attenuator 320 receives the sample of energy travelling in the forward direction on main transmission line 600 produced by coupler 305 (sample of forward energy). Forward resistive attenuator 320 attenuates the sample of energy travelling in the forward direction (RF voltage) received from coupler 305 by setting the voltage level of the sample of forward energy to a level appropriate for the forward compensation capacitor 330. Forward resistive attenuator 320 outputs the attenuated sample of forward energy to forward compensation capacitor 330. Forward resistive attenuator 320 also provides isolation between the circuit components of the coupler 305 and the remainder of the circuit components of the RF power sensor 100, such as the forward compensation capacitor 330 and the power measurement circuit 400. In one exemplary embodiment, the attenuated sample of forward energy can, at maximum full scale power, have a voltage between 32 mVrms to 320 mVrms, from 100 MHz to 1000 MHz, and an attenuation of −74 dB to −54 dB, from 100 MHz to 1000 MHz.

More specifically, forward resistive attenuator 320 receives the sample of energy travelling in the forward direction on main transmission line 600 produced by coupling structure 310 (sample of forward energy). Forward resistive attenuator 320 attenuates the sample of energy travelling in the forward direction (RF voltage) received from coupling structure 310 by setting the voltage level of the sample of forward energy to a level appropriate for the forward compensation capacitor 330. Forward resistive attenuator 320 outputs the attenuated sample of forward energy to forward compensation capacitor 330. Forward resistive attenuator 320 also provides isolation between the circuit components of the coupler 305 and the remainder of the circuit components of the RF power sensor 100, such as the forward compensation capacitor 330 and the power measurement circuit 400.

Even more specifically, forward resistive attenuator 320 receives the sample of energy travelling in the forward direction on main transmission line 600 produced by forward coupler side arm 312 (sample of forward energy). Forward resistive attenuator 320 attenuates the sample of energy travelling in the forward direction (RF voltage) received from forward coupler side arm 312 by setting the voltage level of the sample of forward energy to a level appropriate for the forward compensation capacitor 330. Forward resistive attenuator 320 outputs the attenuated sample of forward energy to forward compensation capacitor 330. Forward resistive attenuator 320 also provides isolation between the circuit components of the coupler 305 and the remainder of the circuit components of the RF power sensor 100, such as the forward compensation capacitor 330 and the power measurement circuit 400.

Accordingly, forward resistive attenuator 320 is configured to receive the sample of energy travelling in the forward direction (RF power) on main transmission line 600 (sample of forward energy) and convert the sample of forward energy to an attenuated sample of forward energy (RF voltage) representative of the forward energy travelling on main transmission line 600.

Reflected resistive attenuator 325 receives the sample of energy travelling in the reflected direction on main transmission line 600 produced by coupler 305 (sample of reflected energy). Reflected resistive attenuator 325 attenuates the sample of energy travelling in the reflected direction (RF voltage) received from coupler 305 by setting the voltage level of the sample of reflected energy to a level appropriate for the reflected compensation capacitor 335. Reflected resistive attenuator 325 outputs the attenuated sample of reflected energy to reflected compensation capacitor 335. Reflected resistive attenuator 325 also provides isolation between the circuit components of the coupler 305 and the remainder of the circuit components of the RF power sensor 100, such as the reflected compensation capacitor 335 and the power measurement circuit 400. In one exemplary embodiment, the attenuated sample of reflected energy can, at maximum full scale power, have a voltage between 10 mVrms to 100 mVrms, from 100 MHz to 1000 MHz, and an attenuation of −74 dB to −54 dB, from 100 MHz to 1000 MHz.

More specifically, reflected resistive attenuator 325 receives the sample of energy travelling in the reflected direction on main transmission line 600 produced by coupling structure 310 (sample of reflected energy). Reflected resistive attenuator 325 attenuates the sample of energy travelling in the reflected direction (RF voltage) received from coupling structure 310 by setting the voltage level of the sample of reflected energy to a level appropriate for the reflected compensation capacitor 335. Reflected resistive attenuator 325 outputs the attenuated sample of reflected energy to reflected compensation capacitor 335. Reflected resistive attenuator 325 also provides isolation between the circuit components of the coupler 305 and the remainder of the circuit components of the RF power sensor 100, such as the reflected compensation capacitor 335 and the power measurement circuit 400.

Even more specifically, reflected resistive attenuator 325 receives the sample of energy travelling in the reflected direction on main transmission line 600 produced by reflected coupler side arm 314 (sample of reflected energy). Reflected resistive attenuator 325 attenuates the sample of energy travelling in the reflected direction (RF voltage) received from reflected coupler side arm 314 by setting the voltage level of the sample of reflected energy to a level appropriate for the reflected compensation capacitor 335. Reflected resistive attenuator 325 outputs the attenuated sample of reflected energy to reflected compensation capacitor 335. Reflected resistive attenuator 325 also provides isolation between the circuit components of the coupler 305 and the remainder of the circuit components of the RF power sensor 100, such as the reflected compensation capacitor 335 and the power measurement circuit 400.

Accordingly, reflected resistive attenuator 325 is configured to receive the sample of energy travelling in the reflected direction (RF power) on main transmission line 600 (sample of reflected energy) and convert the sample of reflected energy to an attenuated sample of reflected energy (RF voltage) representative of the reflected energy travelling on main transmission line 600.

Forward resistive attenuator 320 and reflected resistive attenuator 325 also allow the forward and reflected outputs (forward coupler side arm 312 and reflected coupler side arm 314) of the coupler 305 to be well matched in order to maintain good directivity.

In one exemplary embodiment, forward resistive attenuator 320 and reflected resistive attenuator 325 each provide about 30 dB of attenuation. In an exemplary embodiment, the 30 dB of attenuation can come in the form of a 20 dB chip attenuator and a 10 dB lumped attenuator. In an exemplary embodiment, the 10 dB lumped attenuator can be in the form of three resistors.

When the coupling length $D_1$ of coupled line 311 is reduced significantly below $\lambda/4$, the coupling is no longer flat, but increases with frequency at a rate of about 20 dB/decade. In one exemplary embodiment, the resulting directivity is around about 30 dB, but coupling increases between about 100-1000 MHz from about −44 dB to about −24 dB.

To overcome this problem, forward compensation capacitor 330 and reflected compensation capacitor 335 are used to reduce the coupling by about 20 dB/decade, resulting in a flat response from coupler 305. In some embodiments, this can further reduce the signal level to achieve an overall coupling of about −83 dB that is flat from about 100 MHz to about 1000 MHz. This can also reduce the driving impedance to the forward square-law detector 410 and reflected square-law detector 415 to about 0.5 Ohms.

Forward compensation capacitor 330 receives the attenuated sample of forward energy from forward resistive attenuator 320. Forward compensation capacitor 330 processes the attenuated sample of forward energy, and outputs the frequency-compensated sample of forward energy to forward square-law detector 410 of power measurement circuit 400. In one exemplary embodiment, forward compensation capacitor 330 processes the attenuated sample of forward energy by carrying out one or more of flattening the frequency response, reducing the signal level (voltage division), and reducing the impedance seen by forward square-law detector 410. All of these are beneficial for driving the forward square-law detector 410 and reflected square-law detector 415 properly. In one exemplary embodiment, the frequency-compensated sample of forward energy can, at maximum full scale power, have a voltage of 9 mVrms and an attenuation of −85 dB.

Reflected compensation capacitor 335 receives the attenuated sample of reflected energy from reflected resistive attenuator 325. Reflected compensation capacitor 335 processes the attenuated sample of reflected energy, and outputs the frequency-compensated sample of reflected energy to reflected square-law detector 415 of power measurement circuit 400. In one exemplary embodiment, reflected compensation capacitor 335 processes the attenuated sample of reflected energy by carrying out one or more of flattening the frequency response, reducing the signal level (voltage division), and reducing the impedance seen by reflected square-law detector 415. In one exemplary embodiment, the frequency-compensated sample of reflected energy can, at maximum full scale power, have a voltage of 9 mVrms and an attenuation of −75 dB.

In an exemplary embodiment, forward compensation capacitor 330 can be a shunt capacitor 332. In another exemplary embodiment, the forward compensation capacitor 330 can be a series capacitor 331 and a shunt capacitor 332 configured as a capacitive divider. In an exemplary embodiment, the shunt capacitor 332 can be a feed-thru type capacitor, grounded to a shield area 520 of PCB 500. In an exemplary embodiment, the feed-thru type shunt capacitor 332 can be grounded to forward can 521.

In an exemplary embodiment, reflected compensation capacitor 335 can be a shunt capacitor 337. In another exemplary embodiment, the reflected compensation capacitor 335 can be a series capacitor 336 and a shunt capacitor 337 configured as a capacitive divider. In an exemplary embodiment, the shunt capacitor 337 can be a feed-thru type capacitor, grounded to a shield area 520 of PCB 500. In an exemplary embodiment, the feed-thru type shunt capacitor 337 can be grounded to reflected can 522.

Figure 17A:
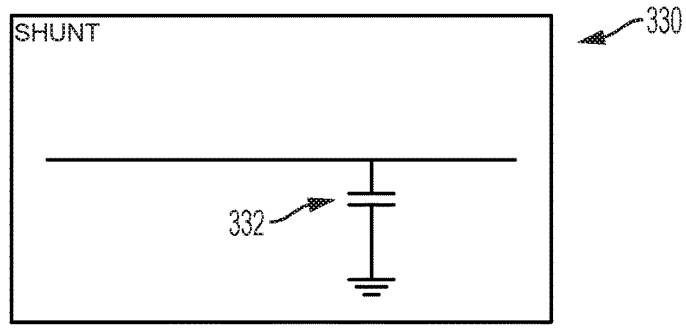
FIGS. 17A-E are schematics of various configurations of forward compensation capacitor of RF power sensor in accordance with an exemplary embodiment of the invention.
Figure 17B:
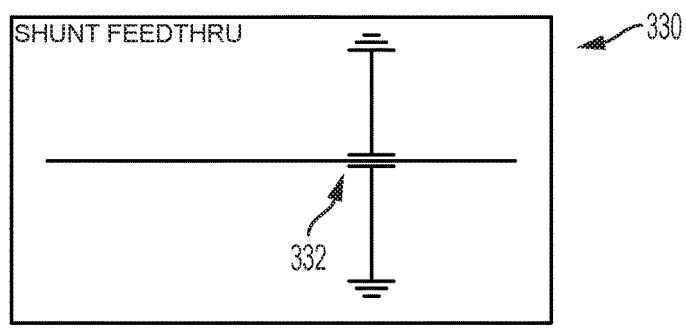
Figure 17C:
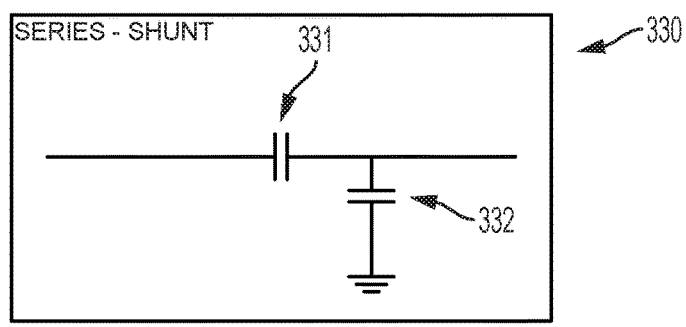
Figure 17D:
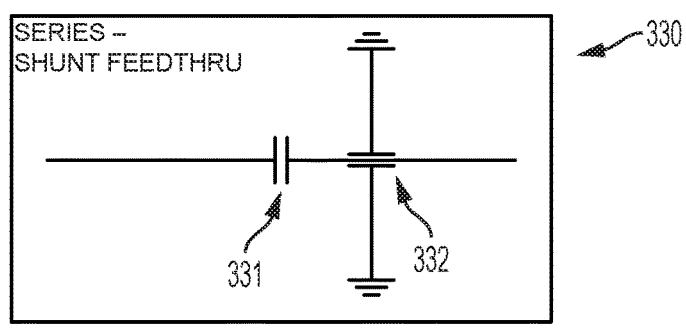
Figure 17E:
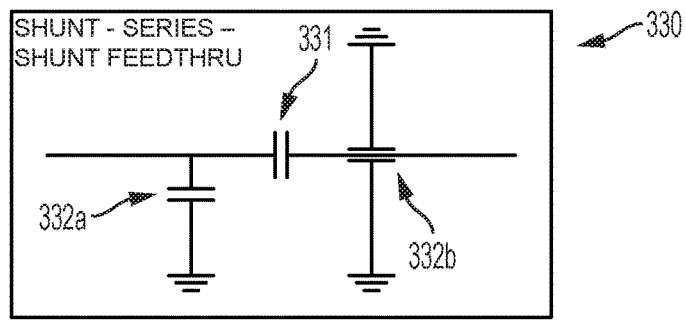

The above configurations for forward compensation capacitor 330 and reflected compensation capacitor 335 are illustrated in FIGS. 17A-E for forward compensation capacitor 330 and FIGS. 18A-E for reflected compensation capacitor 335. FIG. 17A shows forward compensation capacitor 330 in a shunt capacitor configuration using shunt capacitor 332. FIG. 17B shows forward compensation capacitor 330 in a shunt feedthru capacitor configuration using shunt capacitor 332 configured as a feedthru. FIG. 17C shows forward compensation capacitor 330 in a series—shunt configuration using series capacitor 331 and shunt capacitor 332. FIG. 17D shows forward compensation capacitor 330 in a series—shunt feedthru configuration using series capacitor 331 and shunt capacitor 332 configured as a feedthru. FIG. 17E shows forward compensation capacitor 330 in a shunt—series—shunt feedthru configuration using first shunt capacitor 332a, series capacitor 331, and second shunt capacitor 332b configured as a feedthru.

Figure 18A:
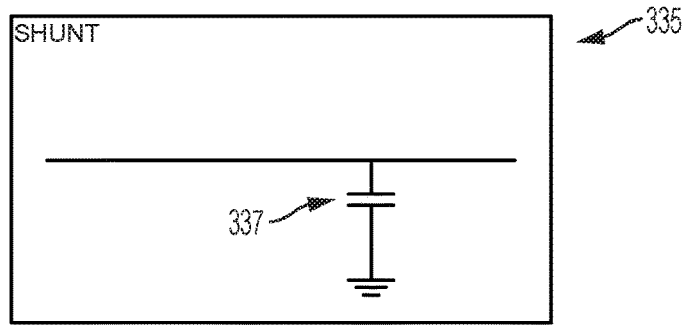
FIGS. 18A-E are schematics of various configurations of reflected compensation capacitor of RF power sensor in accordance with an exemplary embodiment of the invention.
Figure 18B:
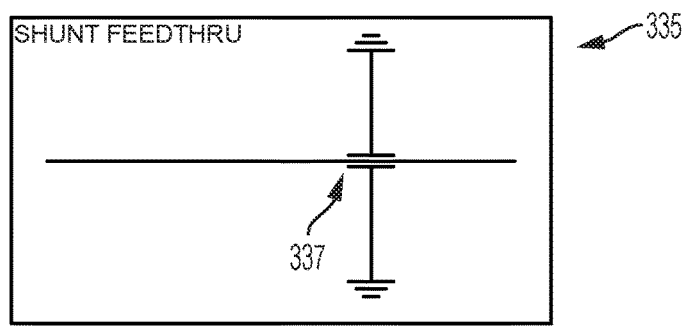
Figure 18C:
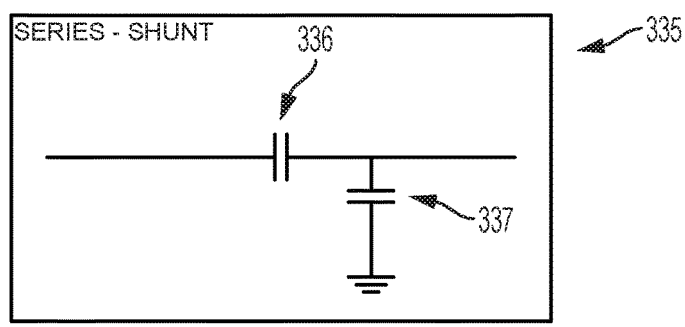
Figure 18D:
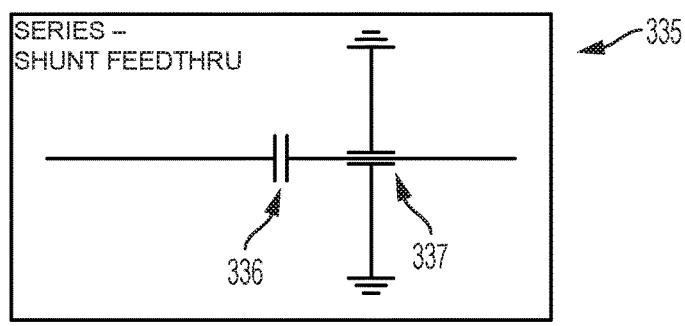
Figure 18E:
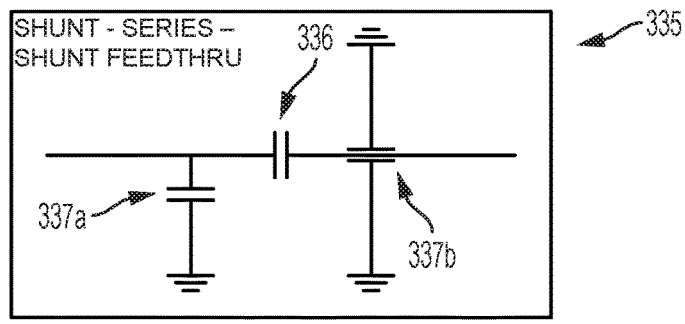

FIG. 18A shows reflected compensation capacitor 335 in a shunt capacitor configuration using shunt capacitor 337. FIG. 18B shows reflected compensation capacitor 335 in a shunt feedthru capacitor configuration using shunt capacitor 337 configured as a feedthru. FIG. 18C shows reflected compensation capacitor 335 in a series—shunt configuration using series capacitor 336 and shunt capacitor 337. FIG. 18D shows reflected compensation capacitor 335 in a series—shunt feedthru configuration using series capacitor 336 and shunt capacitor 337 configured as a feedthru. FIG. 18E shows reflected compensation capacitor 335 in a shunt—series—shunt feedthru configuration using first shunt capacitor 337a, series capacitor 336, and second shunt capacitor 337b configured as a feedthru.

Figure 13:
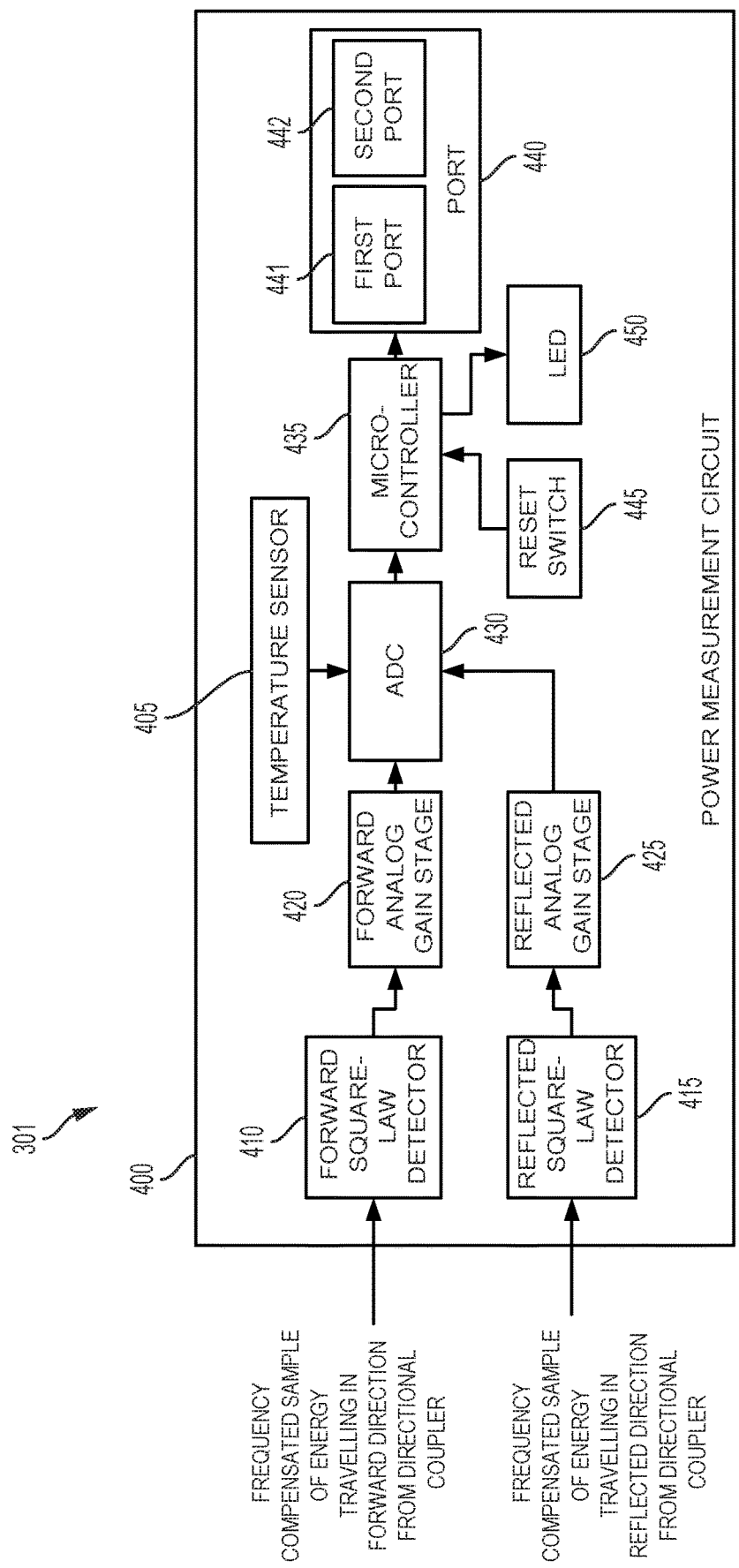
FIG. 13 is a block diagram for a power measurement circuit of RF power sensor in accordance with an exemplary embodiment of the invention.

FIG. 13 is a block diagram of power measurement circuit 400 of RF power sensor 100. Forward square-law detector 410 receives the frequency-compensated sample of forward energy (RF voltage) from forward compensation capacitor 330 and outputs to forward analog gain stage 420 a forward analog DC voltage representative of the forward energy travelling on main transmission line 600. Accordingly, forward square-law detector 410 is configured to receive the frequency-compensated sample of forward energy (RF voltage) representative of the forward energy travelling on main transmission line 600, convert the frequency-compensated sample of forward energy to a forward analog DC voltage representative of the forward energy travelling on main transmission line 600, and provide the forward analog DC voltage to forward analog gain stage 420. In one exemplary embodiment, the forward analog DC voltage output can, at maximum full scale power, have a voltage of about 1 mV.

Reflected square-law detector 415 receives the frequency-compensated sample of reflected energy (RF voltage) from reflected compensation capacitor 335 and outputs to reflected analog gain stage 425 a reflected analog DC voltage representative of the reflected energy travelling on main transmission line 600. Accordingly, reflected square-law detector 415 is configured to receive the frequency-compensated sample of reflected energy (RF voltage) representative of the reflected energy travelling on main transmission line 600, convert the frequency-compensated sample of reflected energy to a reflected analog DC voltage representative of the reflected energy travelling on main transmission line 600, and provide the reflected analog DC voltage to reflected analog gain stage 425. In one exemplary embodiment, the reflected analog DC voltage output can, at maximum full scale power, have a voltage of about 1 mV.

Forward analog gain stage 420 receives the forward analog DC voltage from the forward square-law detector 410, amplifies the forward analog DC voltage to a level sufficient for processing by the analog to digital converter (ADC) 430, thereby producing an amplified forward DC voltage. The forward analog gain stage 420 outputs the amplified forward DC voltage to the ADC 430. Accordingly, the forward analog gain stage 420 is configured to receive the forward analog DC voltage representative of the forward energy travelling on main transmission line 600, produce an amplified forward DC voltage having a level sufficient for processing by the ADC 430 by amplifying the forward analog DC voltage, and output the amplified forward DC voltage to the ADC 430. In one exemplary embodiment, the amplified forward DC voltage output can, at maximum full scale power, have a voltage of about 1 V.

Reflected analog gain stage 425 receives the reflected analog DC voltage from the reflected square-law detector 415, amplifies the reflected analog DC voltage to a level sufficient for processing by ADC 430, thereby producing an amplified reflected DC voltage. The reflected analog gain stage 425 outputs the amplified reflected DC voltage to the ADC 430. Accordingly, the reflected analog gain stage 425 is configured to receive the reflected analog DC voltage representative of the reflected energy travelling on main transmission line 600, produce an amplified reflected DC voltage having a level sufficient for processing by the ADC 430 by amplifying the reflected analog DC voltage, and output the amplified reflected DC voltage to the ADC 430.

In one exemplary embodiment, the amplified reflected DC voltage output can, at maximum full scale power, have a voltage of about 1 V.

The temperature sensor 405 is located in close proximity to the forward square-law detector 410 and reflected square-law detector 415 and measures the ambient temperature in the proximity of the forward square-law detector 410 and reflected square-law detector 415. Accordingly, temperature sensor 405 is configured to measure the ambient temperature in the proximity of forward square-law detector 410 and reflected square-law detector 415 and provide a temperature level output to the ADC 430 in the form of an analog DC voltage. The temperature level output of temperature sensor 405 is then digitized and provided to microcontroller 435. In one exemplary embodiment, the temperature level output can have a voltage of about 424 mVDC to 740 mVDC, from 0° C. to 50° C.

The output of the forward square-law detector 410 and reflected square-law detector 415 varies with the ambient temperature. The microcontroller 435 uses the temperature level output of temperature sensor 405 in conjunction with the temperature characterization curve of the forward square-law detector 410 and reflected square-law detector 415 stored in microcontroller 435 to compensate for the effects of thermally induced drift in the forward square-law detector 410 and reflected square-law detector 415. Further, microcontroller 435 uses a calibration correction factor for each of the forward channel 301 and reflected channel 302 to help attain good absolute accuracy of measured RF power to a NIST traceable standard. The calibration correction factor corrects for any static variation from RF power sensor 100 to RF power sensor 100 in areas such as, but not limited to, coupling levels, losses, detector response, and amplifier gain.

In an exemplary embodiment, the forward channel 301 can include coupler transmission line section 251, coupled line 311, forward coupler side arm 312, forward resistive attenuator 320, forward compensation capacitor 330, forward square-law detector 410, forward analog gain stage 420, and analog to digital converter 430. The reflected channel 302 can include coupler transmission line section 251, coupled line 311, reflected coupler side arm 314, reflected resistive attenuator 325, reflected compensation capacitor 335, reflected square-law detector 415, reflected analog gain stage 425, and analog to digital converter 430. The calibration correction factor for the forward channel 301 and the reflected channel 302 can be determined by the factory at the time of manufacture and stored in memory 437 of microcontroller 435.

ADC 430 receives the analog amplified forward DC voltage output from the forward analog gain stage 420, amplified reflected DC voltage output from the reflected analog gain stage 425, and temperature level output from temperature sensor 405. ADC 430 digitizes the analog amplified forward DC voltage output from the forward analog gain stage 420, amplified reflected DC voltage output from the reflected analog gain stage 425, and temperature level output from temperature sensor 405. ADC 430 produces and outputs to microcontroller 435 values for the digitized forward power (digitized amplified forward DC voltage output from the forward analog gain stage 420), digitized reflected power (digitized amplified reflected DC voltage output from the reflected analog gain stage 425), and digitized temperature (digitized temperature level output from temperature sensor 405).

Accordingly, ADC 430 is configured to receive and digitize the amplified forward DC voltage output from the forward analog gain stage 420 which is representative of the forward energy travelling on main transmission line 600, receive the amplified reflected DC voltage output from the reflected analog gain stage 425 which is representative of the reflected energy travelling on main transmission line 600, and temperature level output from temperature sensor 405 which is representative of the ambient air temperature around forward square-law detector 410 and reflected square-law detector 415, and output the digitized values for the digitized forward power, digitized reflected power, and digitized temperature to microcontroller 435. Therefore, ADC 430 is configured to receive the analog values for amplified forward DC voltage output from the forward analog gain stage 420, the amplified reflected DC voltage output from the reflected analog gain stage 425, and temperature level output from temperature sensor 405, digitize the analog received values, and output the digitized values for the digitized forward power, digitized reflected power, and digitized temperature to microcontroller 435.

Microcontroller 435 receives the digitized values for the digitized forward power, digitized reflected power, and digitized temperature output from ADC 430. Microcontroller 435 applies a temperature correction and a calibration correction factor for the forward channel 301 to the digitized forward power and outputs the corrected digitized forward power to port 440 for output to channel power meter 720. Microcontroller 435 also applies the temperature correction and a calibration correction factor for the reflected channel 302 to digitized reflected power, and outputs the corrected reflected power to port 440 for output to channel power meter 720. The microcontroller 435 uses the temperature level output of temperature sensor 405 in conjunction with the temperature characterization curve of the forward square-law detector 410 and the temperature characterization curve of the reflected square-law detector 415 stored in microcontroller 435 to apply a temperature correction to the digitized forward power and digitized reflected power values received from ADC 430. The temperature correction applied by microcontroller 435 to the digitized forward power and the digitized reflected power compensates for the effects of thermally induced drift in the forward square-law detector 410 and reflected square-law detector 415. The calibration correction factors applied by microcontroller 435 correct for any static variation from RF power sensor 100 to RF power sensor 100 in areas such as, but not limited to, coupling levels, losses, detector response, and amplifier gain.

Further, microcontroller 435 also receives the output from reset switch 445. Microcontroller 435 is also configured to restart when reset switch 445 is pressed, which may be used to "wake-up" microcontroller 435 should microcontroller 435 enter a sleep state. Microcontroller 435 is further configured to control the state of LED 450. In an exemplary embodiment, microcontroller 435 is configured to illuminate LED 450 when RF power sensor 100 is provided with electrical power through port 440. In another exemplary embodiment, microcontroller 435 is configured to illuminate LED 450 to indicate special conditions of RF power sensor 100 such as, but not limited to, an alarm condition or communication error.

Port 440 receives the corrected digitized forward power and corrected reflected power from microcontroller 435 and provides them for output to channel power meter 720. In an exemplary embodiment, port 440 provides the corrected digitized forward power and corrected reflected power values to channel power meter 720 using serial communication. In another exemplary embodiment, microcontroller 435, through port 440, provides the corrected digitized forward power and corrected reflected power values to channel power meter 720 using serial communication. However, it is contemplated that a person having ordinary skill in the art can choose to provide the corrected digitized forward power and corrected reflected power values to channel power meter 720 using a form of communication other than serial communication.

Figure 14:
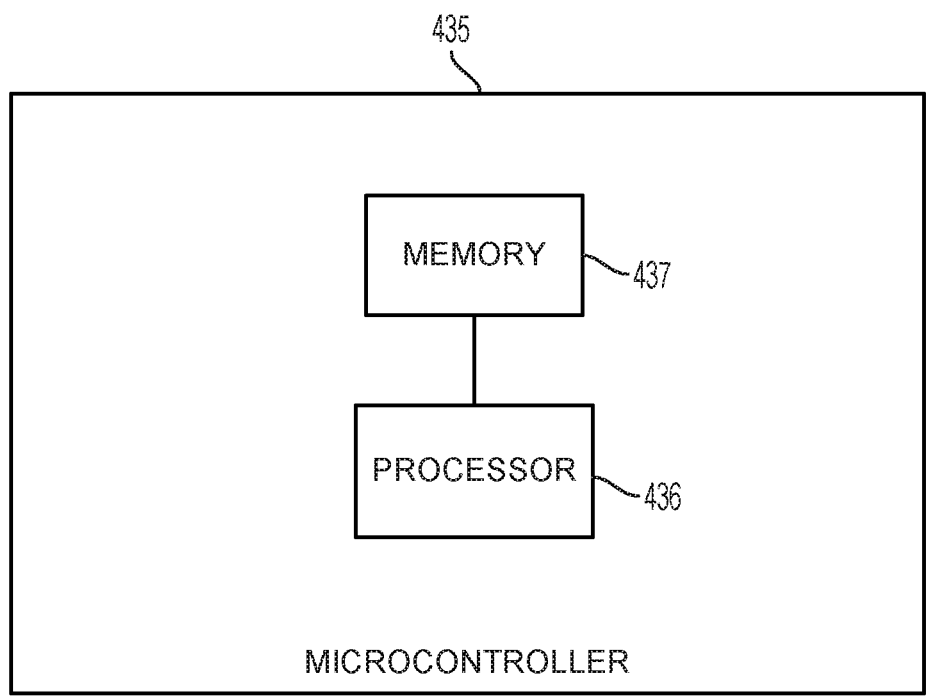
FIG. 14 is a block diagram of a microcontroller of RF power sensor in accordance with an exemplary embodiment of the invention.

FIG. 14 is a block diagram of microcontroller 435, which includes processor 436 and memory 437. In some exemplary embodiments, ADC 430 is integrated into microcontroller 435. Further, in some exemplary embodiments, such as the one shown in FIG. 13, the ADC 430 and microcontroller 435 are not integrated. Further, since microcontroller 435 includes a processor 436 and memory 437, the term microcontroller 435 is intended to encompass embodiments of RF power sensor 100 that are implemented using stand-alone processor 436 and memory 437, and also embodiments of RF power sensor 100 that are implemented using a microcontroller 435 that has an integrated processor 436 and memory 437.

Figure 15:
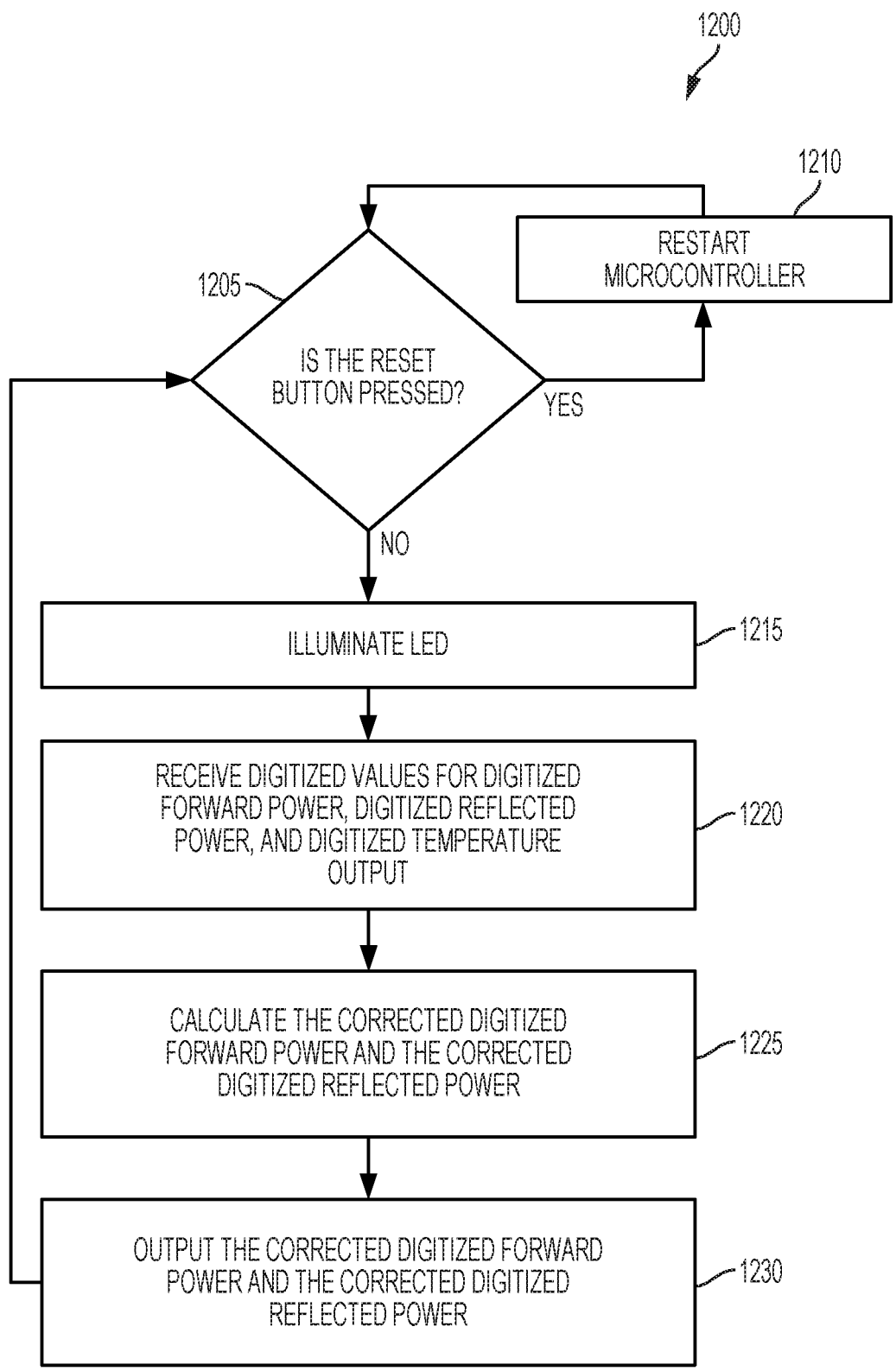
FIG. 15 is a program stored in the memory and executed by the processor of RF power sensor directed to a method for the calculation of forward and reflected power in accordance with an exemplary embodiment of the invention.

The program of FIG. 15 calculates the corrected digitized forward power and corrected reflected power. The program of FIG. 15 is stored in memory 437 and executed by processor 436, and is directed to a method for the calculation the forward and reflected power 1200 on transmission line 600 using the processor 436 and memory 437 of microcontroller 435 of RF power sensor 100.

In block 1205, the status of the reset switch 445 is examined. If the reset switch 445 is pressed, the method progresses to block 1210, where the microcontroller 435 is restarted or "wakes-up" if it has entered a sleep mode. After the microcontroller 435 is restarted, the method progresses back to block 1205.

If the reset switch 445 is not pressed in block 1205, the method progresses to block 1215, where LED 450 is illuminated, indicating that RF power sensor 100 is receiving electrical power. In one exemplary embodiment, the electrical power for RF power sensor 100 is provided by channel power meter 720 through port 440.

In an exemplary embodiment, processor 436 pauses before block 1220, until processor 436 receives a request for a measurement of forward and reflected power on main transmission line 600. In another exemplary embodiment, processor 436 pauses before block 1220, until a measurement of forward and reflected power is requested by channel power meter 720.

In block 1220, the digitized values for digitized forward power, digitized reflected power, and digitized temperature output are received by processor 436 from ADC 430 and stored in memory 437. The temperature characterization curve of the forward square-law detector 410, the calibration correction factor for the forward channel 301, the temperature characterization curve of the reflected square-law detector 415, and the and calibration correction factor for the reflected channel 302 are stored in memory 437 at the factory.

In block 1225, the corrected digitized forward power value and the corrected digitized reflected power value are calculated by processor 436. More specifically, the processor 436 retrieves the temperature characterization curve of the forward square-law detector 410, calibration correction factor of the forward channel 301, digitized value for the digital forward power, and the digitized temperature output value from memory 437. Processor 436 calculates the corrected digitized forward power value using the temperature characterization curve of the forward square-law detector 410, calibration correction factor of the forward channel 301, digitized value for the digital forward power, and the digitized temperature output value. Processor 436 stores the calculated corrected digitized forward power value in memory 437.

Further, the processor 436 retrieves the temperature characterization curve of the reflected square-law detector 415, calibration correction factor of the reflected channel 302, digitized value for the digital reflected power, and the digitized temperature output value from memory 437. Processor 436 calculates the corrected digitized reflected power value using the temperature characterization curve of the forward square-law detector 410, and calibration correction factor of the reflected channel 302, digitized value for the digital reflected power, and the digitized temperature output value. Processor 436 stores the calculated corrected digitized reflected power value in memory 437.

In block 1230, processor 436 retrieves the calculated corrected digitized forward power value and calculated corrected digitized reflected power value from memory 437. Processor 436 outputs the corrected digitized forward power value and corrected digitized reflected power value to channel power meter 720 using port 440. The method then progresses back to block 1205.

Figure 19:
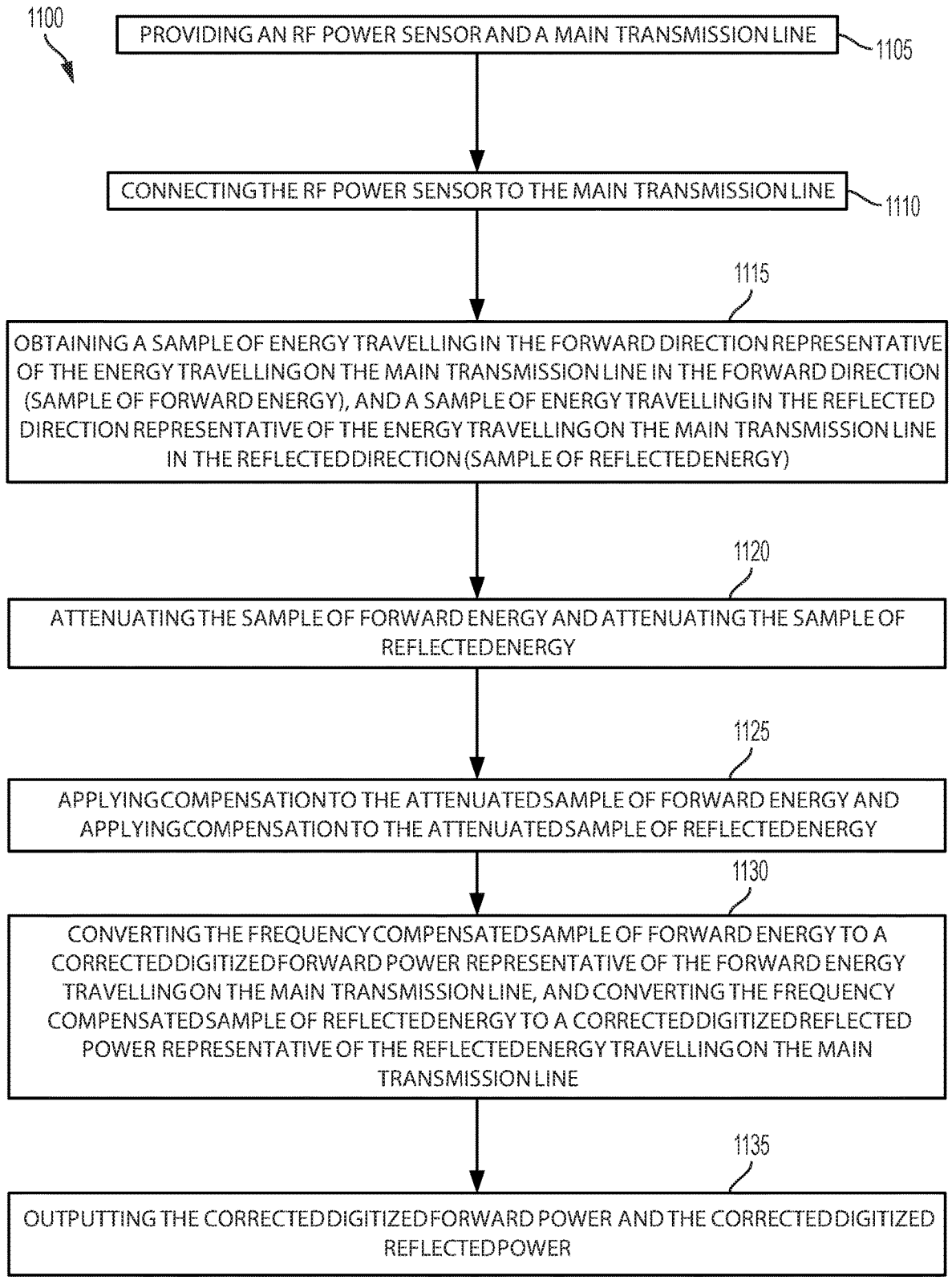
FIGS. 19-20 are flow charts of a method of using RF power sensor in accordance with an exemplary embodiment of the invention.
Figure 20:
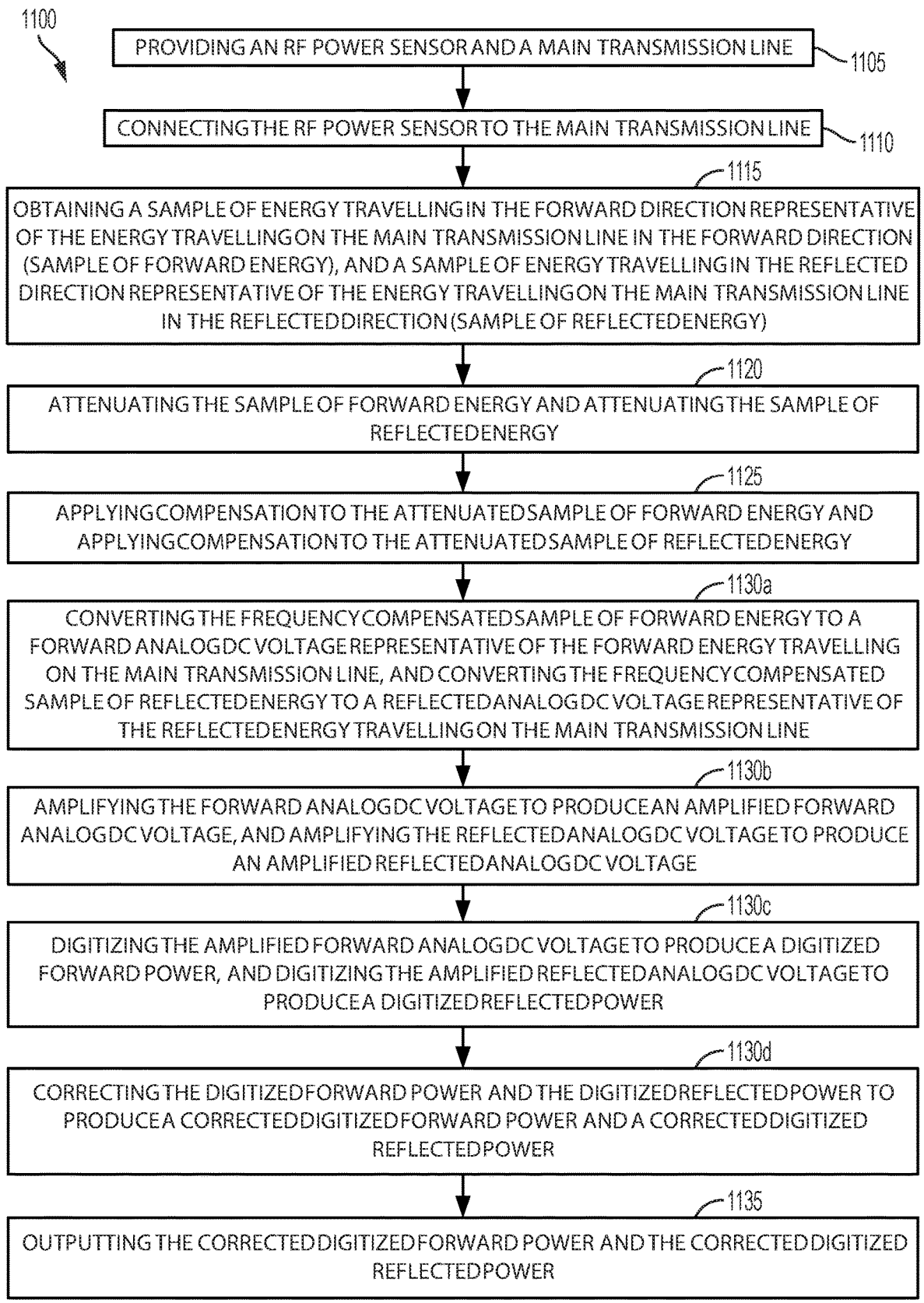

FIGS. 19-20 are flow charts of a method 1100 of using RF power sensor 100 in accordance with an exemplary embodiment of the invention. In block 1105, RF power sensor 100 and main transmission line 600 are provided. In block 1110, RF power sensor 100 is connected to the main transmission line 600.

In block 1115, a sample of forward energy and a sample of reflected energy from main transmission line 600 are obtained by RF power sensor 100 using frequency compensated shortline directional coupler 300. More specifically, the coupler 305 and coupling structure 310 of directional coupler 300 obtain the sample of forward energy and the sample of reflected energy. Even more specifically, coupled line 311 and forward coupler side arm 312 obtain the sample of forward energy from the coupler transmission line section 251, and the coupled line 311 and reflected coupler side arm 314 obtain the sample of forward energy from the coupler transmission line section 251. The sample of forward energy is representative of the energy travelling on the main transmission line 600 in the forward direction. The sample of reflected energy is representative of the energy travelling on the main transmission line 600 in the reflected direction.

In block 1120, forward resistive attenuator 320 attenuates the sample of forward energy using forward resistive attenuator 320, thereby producing an attenuated sample of forward energy. Further, reflected resistive attenuator 325 attenuates the sample of reflected energy using reflected resistive attenuator 325, thereby producing an attenuated sample of reflected energy.

In block 1125, forward compensation capacitor 330 applies compensation to the attenuated sample of forward energy, thereby producing a frequency-compensated sample of forward energy. Further, reflected compensation capacitor 335 applies compensation to the attenuated sample of reflected energy, thereby producing a frequency-compensated sample of reflected energy.

In block 1130, power measurement circuit 400 converts the frequency-compensated sample of forward energy into a corrected digitized forward power representative of the forward energy travelling on the main transmission line 600. Further, power measurement circuit 400 converts the frequency-compensated sample of reflected energy into a corrected digitized reflected power representative of the reflected energy travelling on the main transmission line 600.

In block 1135, power measurement circuit 400 outputs the corrected digitized forward power and the corrected digitized reflected power. In an exemplary embodiment, power measurement circuit 400 outputs the corrected digitized forward power and the corrected digitized reflected power using port 440. In another exemplary embodiment, power measurement circuit 400 outputs the corrected digitized forward power and the corrected digitized reflected power using port 440 to channel power meter 720.

Blocks 1130*a*-1130*d* of FIG. 20 provide additional details regarding the acts taking place in block 1130 of FIG. 19 by power measurement circuit 400. In block 1130*a*, the frequency-compensated sample of forward energy is converted by forward square-law detector 410 to a forward analog DC voltage representative of the forward energy travelling on main transmission line 600. Further, the frequency-compensated sample of reflected energy is converted by reflected square-law detector 415 to a reflected analog DC voltage representative of the reflected energy travelling on main transmission line 600.

In block 1130*b*, the forward analog DC voltage is amplified by forward analog gain stage 420, thereby producing an amplified forward analog DC voltage. Further, the reflected analog DC voltage is amplified by reflected analog gain stage 425, thereby producing an amplified reflected analog DC voltage.

In block 1130*c*, the amplified forward analog DC voltage is digitized by ADC 430 into a digitized forward power value, and the amplified reflected analog DC voltage is digitized by ADC 430 into a digitized reflected power value.

In block 1130*d*, a temperature correction and calibration correction factor are applied to the digitized forward power by microcontroller 435, thereby producing the corrected digitized forward power that is outputted by power measurement circuit 400 in block 1135. In an exemplary embodiment, the calibration correction factor applied to the digitized forward power is a calibration correction factor for the forward channel 301. Further, a temperature correction and calibration correction factor are applied to the digitized reflected power by microcontroller 435, thereby producing the corrected digitized reflected power that is outputted by power measurement circuit 400 in block 1135. In an exemplary embodiment, the calibration correction factor applied to the digitized reflected power is a calibration correction factor for the reflected channel 302.

Figure 21:
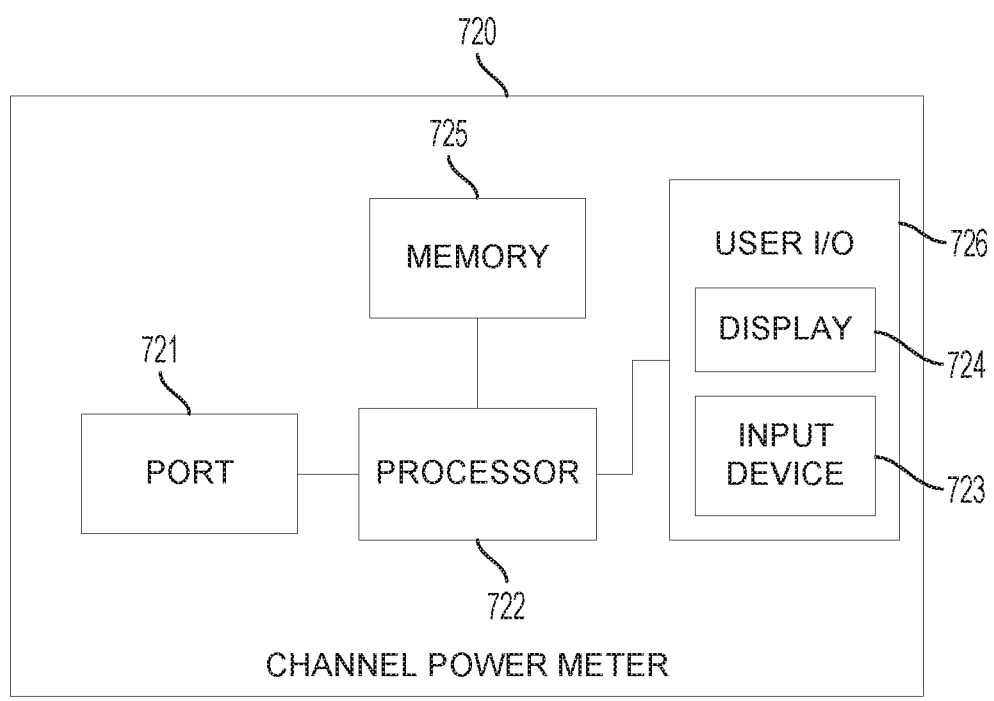
FIG. 21 is a block diagram of a channel power monitor in accordance with an exemplary embodiment of the invention.

FIG. 21 shows a block diagram of channel power meter 720, which includes port 721, processor 722, memory 725, and User I/O 726. User I/O 726 can include one or both of user input device 723 and display 724. In some exemplary embodiments, display 724 and user input device 723 of user I/O 726 can be combined, such as a touch screen. Further, user I/O 726 can have a separate display 724 and user input device 723. In other exemplary embodiments, user input device 723 can be buttons, a keypad or keyboard.

Processor 722 is electrically connected to port 721, display 724, memory 725, and user I/O 726. Channel power meter 720 is configured to receive a corrected digitized forward power from RF power sensor 100 and display to a user, via display 724, the corresponding value of RF power travelling in the forward direction on combined channel transmission line 830. Channel power meter 720 is further configured to receive a corrected digitized reflected power from RF power sensor 100 and display to a user, via display 724, the corresponding value of RF power travelling in the reflected direction on combined channel transmission line 830. A user can utilize user I/O 726 to display the individual values for RF power travelling in the forward and reflected directions, as well as the composite power, on combined channel transmission line 830 as measured by RF power sensor 100. A user can also utilize user I/O 726 to display the VSWR on combined channel transmission line 830.

Figure 22:
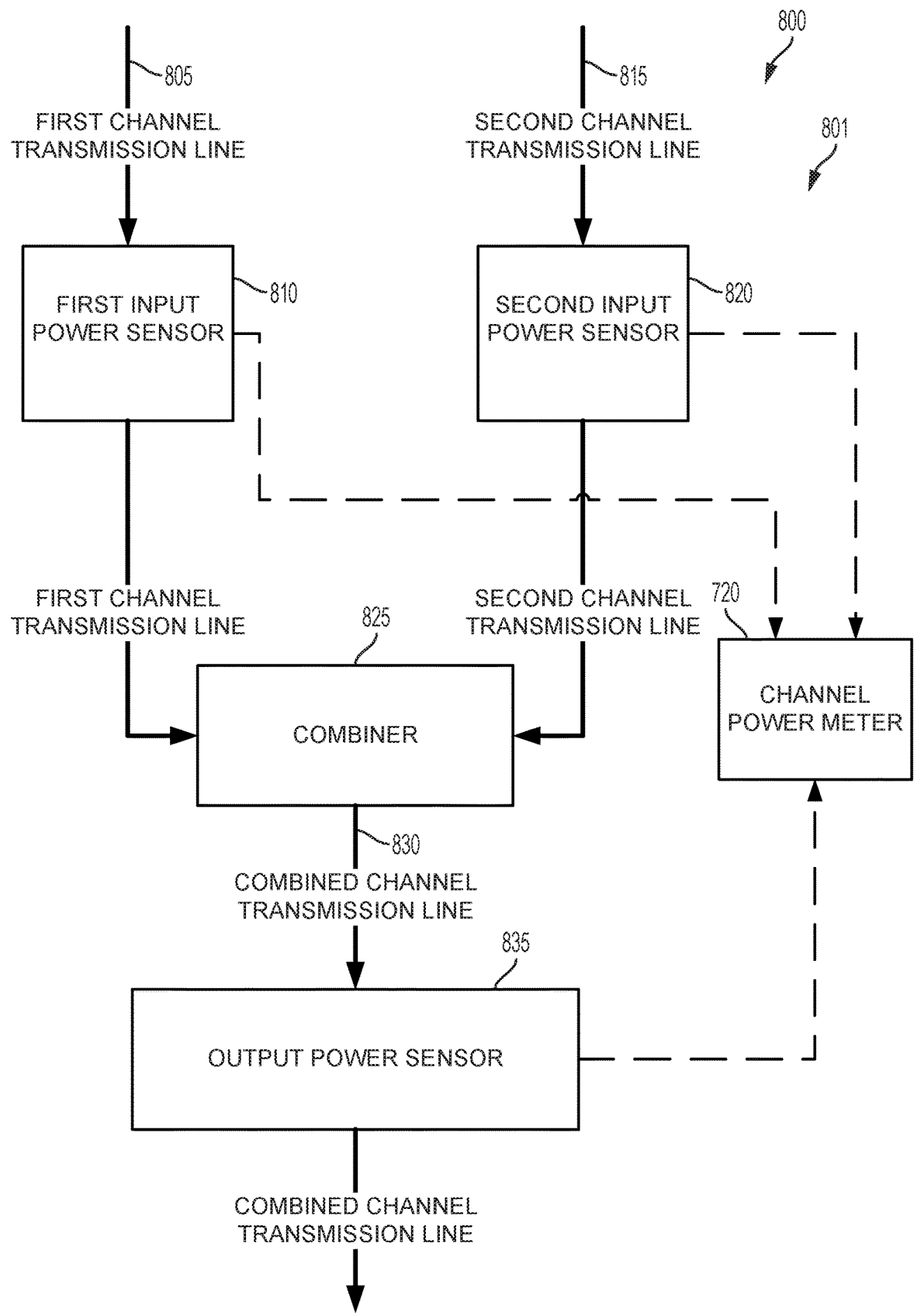
FIG. 22 is a block diagram of an RF power metering system with the RF power sensor in accordance with an exemplary embodiment of the invention.

FIG. 22 shows a block diagram of an RF power metering system 800 for an RF transmission system 801. RF power metering system 800 has a first input power sensor 810, second input power sensor 820, and output power sensor 835. RF transmission system 801 has a first channel transmission line 805, second channel transmission line 815, combiner 825, and combined channel transmission line 830.

First input power sensor 810 is electrically connectable to first channel transmission line 805 and channel power meter 720. Second input power sensor 820 is electrically connectable to second channel transmission line 815 and channel power meter 720. Combiner 825 is electrically connected to first channel transmission line 805, second channel transmission line 815, and combined channel transmission line 830. Output power sensor 835 is electrically connectable to combined channel transmission line 830 and channel power meter 720.

First input power sensor 810 is configured to measure the RF power level on the first channel transmission line 805 and provide the measured RF power level on the first channel transmission line 805 to channel power meter 720. Second input power sensor 820 is configured to measure the RF power level on the second channel transmission line 815 and provide the measured RF power level on the second channel transmission line 815 to channel power meter 720. First input power sensor 810 can be a directional or non-directional power sensor. Second input power sensor 820 can be a directional or non-directional power sensor.

Combiner 825 is configured to combine the first channel from first channel transmission line 805 and the second channel from second channel transmission line 815 onto combined channel transmission line 830. Output power sensor 835 is configured to measure the RF power level for the first channel on the combined channel transmission line 830 and provide the measured RF power level for the first channel to channel power meter 720. Output power sensor 835 is further configured to measure the forward RF power level and reflected RF power level for the first channel on the combined channel transmission line 830 and provide the forward RF power level and reflected RF power level for the first channel to channel power meter 720. Output power sensor 835 is also configured to measure the RF power level for the second channel on the combined channel transmission line 830 and provide the measured RF power level for the second channel to channel power meter 720. Output power sensor 835 is further configured to measure the forward RF power level and reflected RF power level for the second channel on the combined channel transmission line 830 and provide the forward RF power level and reflected RF power level for the second channel to channel power meter 720.

Output power sensor 835 can be any device that is capable of determining directional channelized power, such as a spectrum analyzer. Output power sensor 835 can also be a directional device that is not capable of determining channelized power (e.g. a composite power measurement device), such as RF power sensor 100, as long as only the channel of interest is activated when the RF power level for the channel of interest is being measured. For example, a composite power measurement device can be used as output power sensor 835, if only the first channel is activated during the time the RF power level for the first channel is being measured, and only the second channel is activated during the time the RF power level for the second channel is being measured.

Channel power meter 720 is configured to display the RF power level for the first channel on the first channel transmission line 805, which is the RF power level for the first channel pre-combiner (RF power level for the first channel before entering combiner 825). Channel power meter 720 is also configured to display the RF power level for the second channel on the second channel transmission line 815, which is the RF power level for the second channel pre-combiner (RF power level for the second channel before entering combiner 825). Additionally, channel power meter 720 is configured to display the RF power level for the first channel on the combined channel transmission line 830, which is the RF power level for the first channel post-combiner (RF power level for the first channel after exiting combiner 825). Further, channel power meter 720 is configured to display the RF power level for the second channel on the combined channel transmission line 830, which is the RF power level for the second channel post-combiner (RF power level for the second channel after exiting combiner 825). Further, channel power meter 720 is configured to display the composite RF power level, which is the RF power level for all of the channels post-combiner on the combined channel transmission line 830 (RF power level for all of the channels after exiting combiner 825).

Additionally, channel power meter 720 is configured to display the forward RF power level for the first channel on the combined channel transmission line 830, which is the RF power level for the first channel in the forward direction post-combiner (forward RF power level for the first channel after exiting combiner 825). Also, channel power meter 720 is configured to display the reflected RF power level for the first channel on the combined channel transmission line 830, which is the RF power level for the first channel in the reflected direction post-combiner (reflected RF power level for the first channel after exiting combiner 825). Further, channel power meter 720 is configured to display the forward RF power level for the second channel on the combined channel transmission line 830, which is the forward RF power level for the second channel post-combiner (forward RF power level for the second channel after exiting combiner 825). Further, channel power meter 720 is configured to display the reflected RF power level for the second channel on the combined channel transmission line 830, which is the reflected RF power level for the second channel post-combiner (forward RF power level for the second channel after exiting combiner 825). Further, channel power meter 720 is configured to display the composite RF power level, which is the RF power level for all of the channels post-combiner on the combined channel transmission line 830 (RF power level for all of the channels after exiting combiner 825).

Also, channel power meter 720 is configured to calculate and display the combiner loss for the first channel, which is the difference between the RF power level for the first channel pre-combiner and the RF power level for the first channel post-combiner. Further, channel power meter 720 is configured to calculate and display the combiner loss for the second channel, which is the difference between the RF power level for the second channel pre-combiner and the RF power level for the second channel post-combiner. Additionally, channel power meter 720 is configured to calculate and display the voltage standing wave ratio (VSWR) on combined channel transmission line 830.

Figure 23:
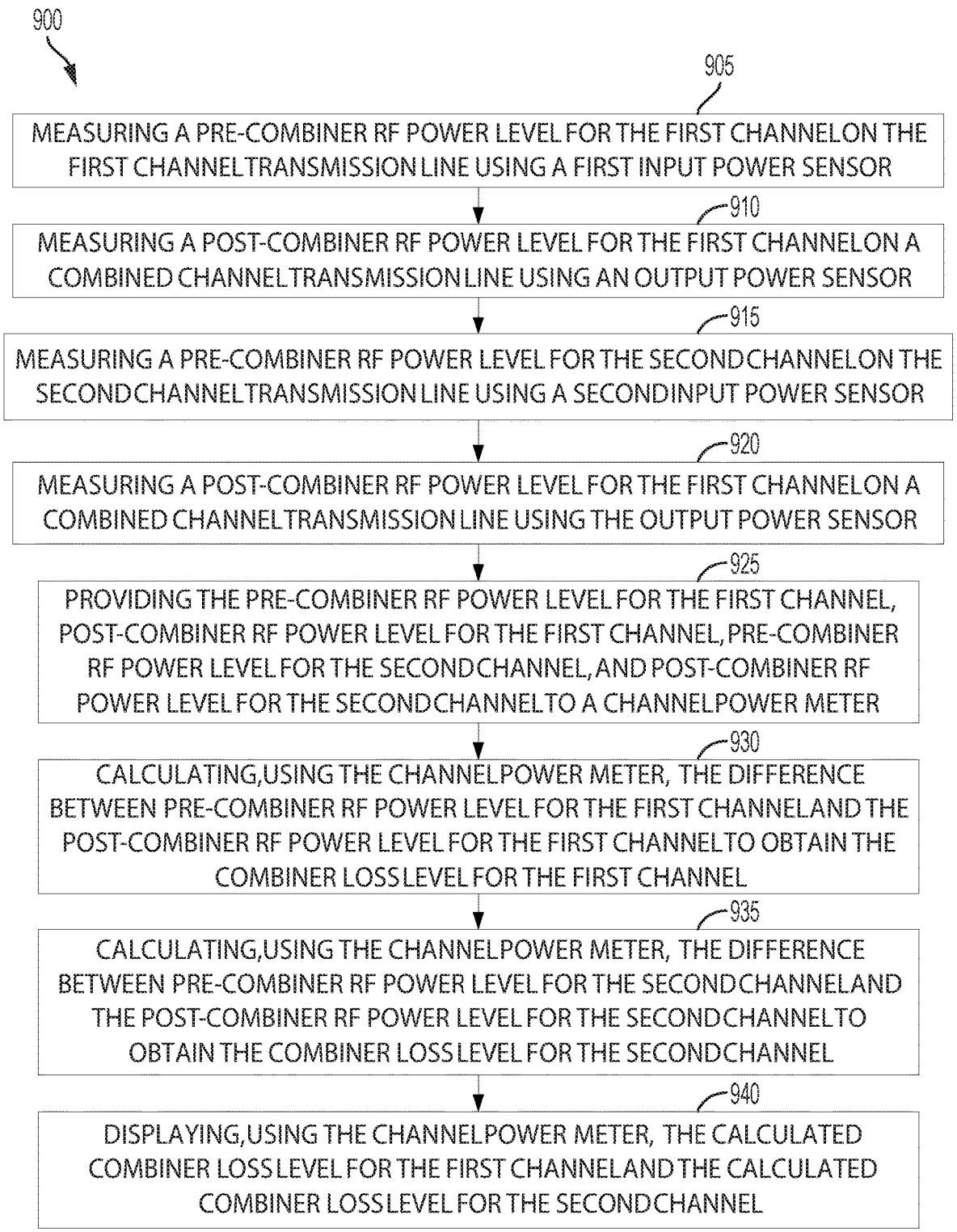
FIG. 23 is a flow chart showing a method for determining combiner loss in the RF transmission system using RF power metering system with RF power sensor in accordance with an exemplary embodiment of the invention.

FIG. 23 is a flow chart showing a method 900 for determining combiner loss in the RF transmission system 801 using RF power metering system 800. In block 905, a pre-combiner RF power level for the first channel on the first channel transmission line is measured using first input power sensor 810. In block 910, a post-combiner RF power level for the first channel on combined channel transmission line 830 is measured using output power sensor 835. In an exemplary embodiment, the post combiner RF power level for the first channel is the forward RF power level for the first channel travelling in a forward direction on combined channel transmission line 830.

In block 915, a pre-combiner RF power level for the second channel on the second channel transmission line 815 is measured using second input power sensor 820. In block 920, a post combiner RF power level for the second channel on combined channel transmission line 830 is measured using output power sensor 835. In an exemplary embodiment, the post combiner RF power level for the second channel is the forward RF power level for the second channel travelling in a forward direction on combined channel transmission line 830.

Output power sensor 835 can also be a directional device that is not capable of determining channelized power (e.g. a composite power measurement device), such as RF power sensor 100, as long as only the channel of interest is activated when the RF power level for the channel of interest is being measured. For example, a composite power measurement device can be used as output power sensor 835, if only the first channel is activated during the time the RF power level for the first channel is being measured, and only the second channel is activated during the time the RF power level for the second channel is being measured.

In block 925, the measured pre-combiner RF power level for the first channel is provided by first input power sensor 810 to channel power meter 720, the measured post-combiner RF power level for the first channel is provided by output power sensor 835 to channel power meter 720, the measured pre-combiner RF power level for the second channel is provided by second input power sensor 820 to channel power meter 720, and the measured post-combiner RF power level for the second channel is provided by output power sensor 835 to channel power meter 720.

In block 930, the combiner loss level for the first channel is calculated using channel power meter 720, by calculating the difference between the pre-combiner RF power level for the first channel and the post-combiner RF power level for the first channel.

In block 935, the combiner loss level for the second channel is calculated, using channel power meter 720, by calculating the difference between the pre-combiner RF power level for the second channel and the post-combiner RF power level for the second channel.

In block 940, the calculated combiner loss level for the first channel and the calculated combiner loss level for the second channel are displayed to the user by channel power meter 720. In an exemplary embodiment, channel power meter 720 displays the calculated combiner loss level for the first channel and the calculated combiner loss level for the second channel using display 724 of user I/O 726.

Figure 24:
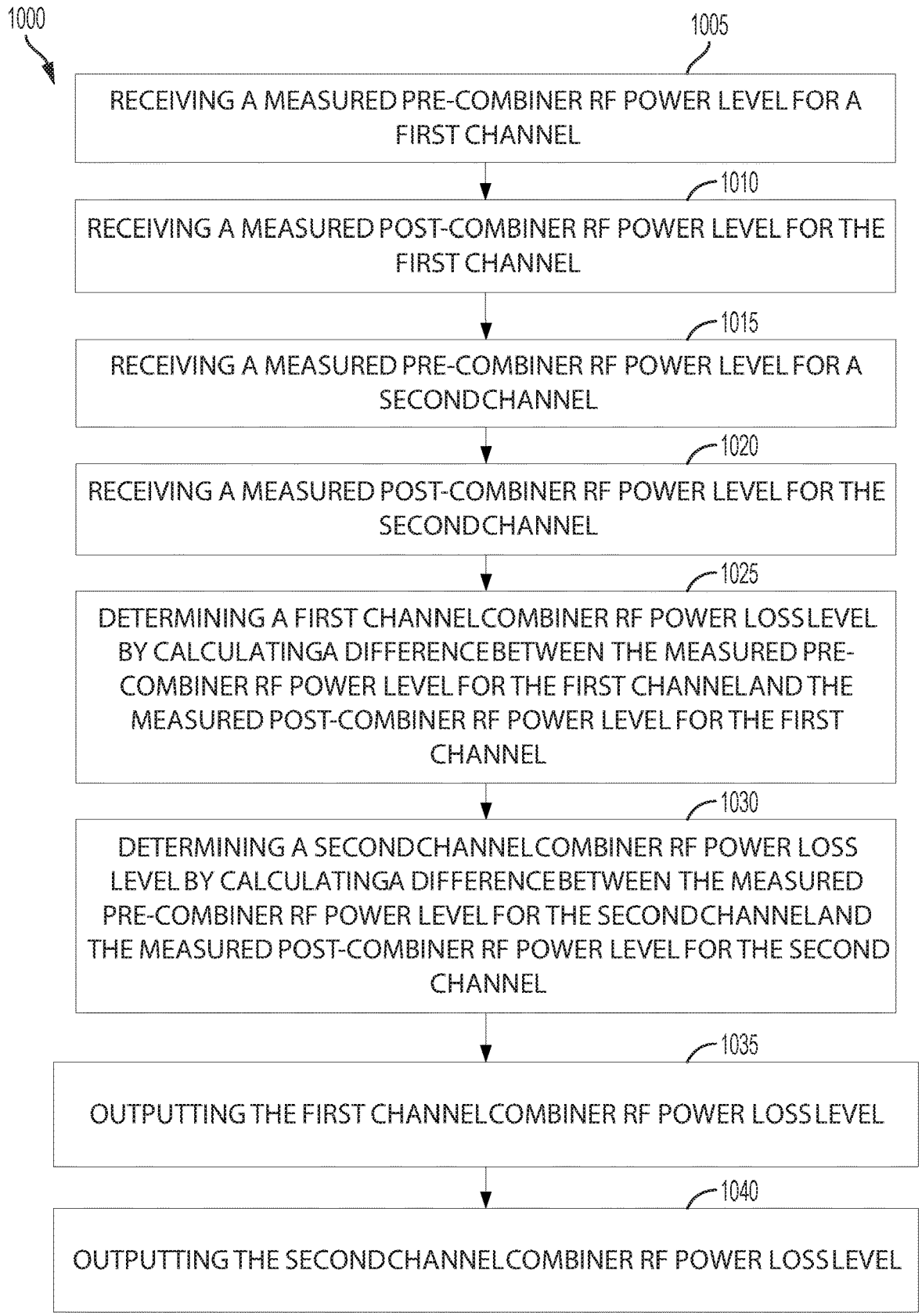
FIG. 24 is a flow chart of a program for calculating loss in a combiner stored in memory and executed by processor of channel power meter of RF power metering system having RF power sensor in accordance with an exemplary embodiment of the invention.

FIG. 24 is a flowchart of a program 1000 for calculating loss in a combiner 825 stored in memory 725 and executed by processor 722 of channel power meter 720 in an exemplary embodiment of RF power metering system 800, and will be described with reference to FIGS. 21-22.

In block 1005 a measured pre-combiner RF power level for a first channel is received by processor 722 and stored in memory 725. In some exemplary embodiments, the measured pre-combiner RF power level for a first channel is received by channel power meter 720 in the form of a scaled DC voltage representative of the energy travelling on first channel transmission line 805 (RF power level for the first channel before entering combiner 825). Measured pre-combiner RF power level for the first channel is measured by and received from first input power sensor 810. The measured pre-combiner RF power level for the first channel is the RF power level on the first channel transmission line 805.

In block 1010, a measured post-combiner RF power level for a first channel is received by processor 722 and stored in memory 725. Measured post-combiner RF power level for the first channel is measured by and received from output power sensor 835. In some exemplary embodiments, the measured post-combiner RF power level for a first channel is a received by channel power meter 720 in the form of corrected digitized forward power representative of the energy travelling in the forward direction on combined channel transmission line 830 for the first channel (RF power level for the first channel after exiting combiner 825). In an exemplary embodiment, output power sensor 835 can be any device that is capable of determining directional channelized power, such as a spectrum analyzer. Output power sensor 835 can also be a directional device that is not capable of determining directional channelized power (e.g. a composite power measurement device), such as RF power sensor 100, as long as only the channel of interest is activated when the RF power level for the channel of interest is being measured. For example, a composite power measurement device can be used as output power sensor 835, if only the first channel is activated during the time the RF power level for the first channel is being measured, and only the second channel is activated during the time the RF power level for the second channel is being measured. The measured post-combiner RF power level for the first channel is the RF power level for the first channel on combined channel transmission line 830.

In block 1015, a measured pre-combiner RF power level for a second channel is received by processor 722 and stored in memory 725. In some exemplary embodiments, the measured pre-combiner RF power level for a second channel is a received by channel power meter 720 in the form of a scaled DC voltage representative of the energy travelling on second channel transmission line 815 (RF power level for the second channel before entering combiner 825). Measured pre-combiner RF power level for the second channel is measured by and received from second input power sensor 820. Second input power sensor 820 can be a non-directional power sensor, such as RF power sensor 100. The measured pre-combiner RF power level for the second channel is the RF power level on the second channel transmission line 815.

In block 1020, a measured post-combiner RF power level for a second channel is received by processor 722 and stored in memory 725. In some exemplary embodiments, the measured post-combiner RF power level for a second channel is a received by channel power meter 720 in the form of corrected digitized forward power representative of the energy travelling in the forward direction on combined channel transmission line 830 for the second channel (RF power level for the second channel after exiting combiner 825). Measured-post combiner RF power level for the second channel is measured by and received from output power sensor 835. In an exemplary embodiment, output power sensor 835 can be any device that is capable of determining directional channelized power, such as a spectrum analyzer. Output power sensor 835 can also be a directional device that is not capable of determining channelized power (e.g. a composite power measurement device), such as RF power sensor 100, as long as only the channel of interest is activated when the RF power level for the channel of interest is being measured. For example, a composite power measurement device can be used as output power sensor 835, if only the first channel is activated during the time the RF power level for the first channel is being measured, and only the second channel is activated during the time the RF power level for the second channel is being measured. The measured post-combiner RF power level for the second channel is the RF power level for the second channel on combined channel transmission line 830.

In block 1025, a first channel combiner RF power loss level is determined by processor 722 by retrieving the measured pre-combiner RF power level for the first channel from memory 725, retrieving the measured post-combiner RF power level for the first channel from memory 725, calculating the difference between the measured pre-combiner RF power level for the first channel and the measured post-combiner RF power level for the first channel, and storing the difference in memory 725 as the first channel combiner RF power loss level.

In block 1030, a second channel combiner RF power loss level is determined by processor 722 by retrieving the measured pre-combiner RF power level for the second channel from memory 725, retrieving the measured post-combiner RF power level for the second channel from memory 725, calculating the difference between the measured pre-combiner RF power level for the second channel and the measured post-combiner RF power level for the second channel, and storing the difference in memory 725 as the second channel combiner RF power loss level.

In block 1035, the first channel combiner RF power loss level is retrieved from memory 725 by processor 722 and outputted to the user. Processor 722 can output the first channel combiner RF power loss level to a user by utilizing user I/O 726. In an exemplary embodiment, processor 722 can output for display, the first channel combiner RF power loss level to a user by utilizing display 724 of user I/O 726.

In block 1040, the second channel combiner RF power loss level is retrieved from memory 725 by processor 722 and outputted to the user. Processor 722 can output the second channel combiner RF power loss level to a user by utilizing user I/O 726. In an exemplary embodiment, processor 722 can output for display, the second channel combiner RF power loss level to a user by utilizing display 724 of user I/O 726.

In an exemplary embodiment, processor 722 can receive the measured pre-combiner RF power level for the first channel, measured post-combiner RF power level for the first channel, measured pre-combiner RF power level for the second channel, and measured post-combiner RF power level for the second channel through port 721 of channel power meter 720.

Figure 25:
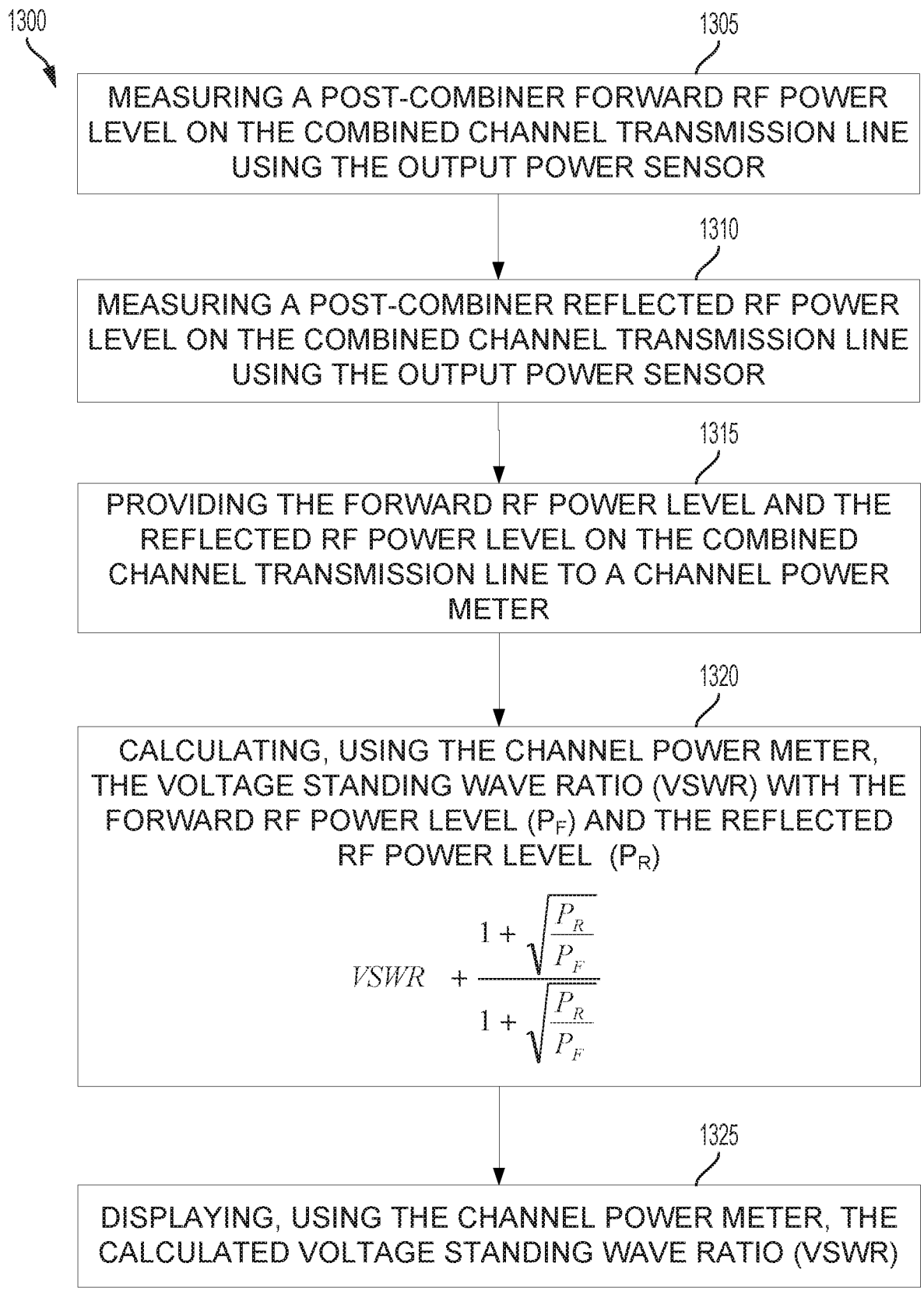
FIG. 25 is a flow chart showing a method for calculating VSWR in the RF transmission system using RF power metering system with RF power sensor in accordance with an exemplary embodiment of the invention.

FIG. 25 is a flow chart showing a method 1300 for determining the voltage standing wave ratio (VSWR) on the combined channel transmission line 830 of RF transmission system 801 using RF power metering system 800. In block 1305, a post-combiner forward RF power level on the combined channel transmission line 830 is measured using the output power sensor 835. In block 1310, a post-combiner reflected RF power level on the combined channel transmission line 830 is measured using output power sensor 835. In an exemplary embodiment, output power sensor 835 is RF power sensor 100.

In block 1315, the measured forward RF power level and the measured reflected RF power level on the combined channel transmission line 830 are provided by output power sensor 835 to a channel power meter 720.

In block 1320, the VSWR is calculated, using the channel power meter 720, according to the following equation 1:

$$VSWR = \frac{1 + \sqrt{\frac{P_R}{P_F}}}{1 - \sqrt{\frac{P_R}{P_F}}} \quad \text{(equation 1)}$$

where, VSWR is the Voltage Standing Wave Ratio, $P_F$ is the forward RF power level, and $P_R$ is the reflected RF power level.

In block 1325, the calculated VSWR level on the combined channel transmission line 830 is displayed to a user by channel power meter 720. In an exemplary embodiment, channel power meter 720 displays the calculated VSWR level using display 724 of user I/O 726.

Figure 26:
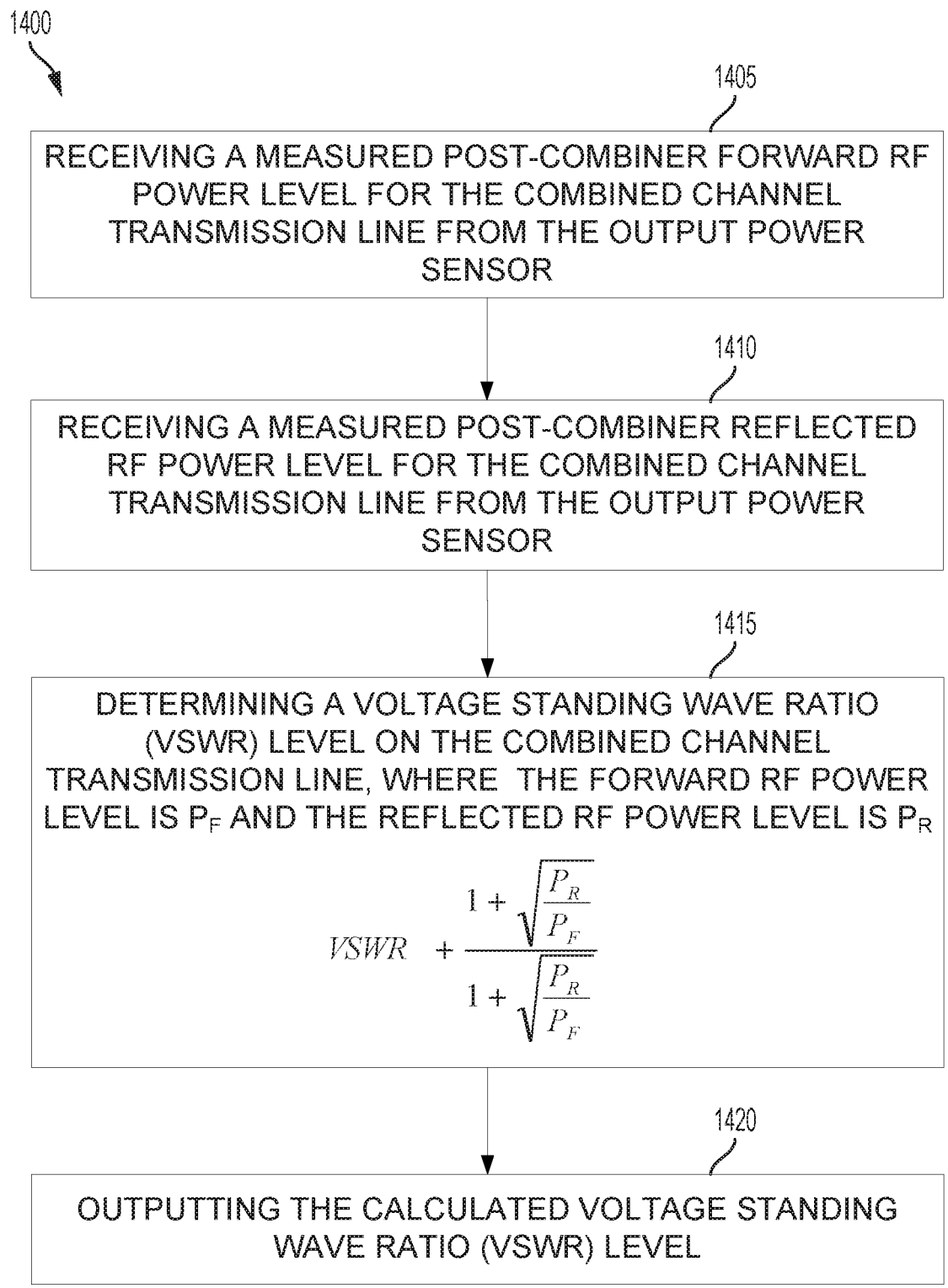
FIG. 26 is a flow chart of a program for calculating VSWR in in the RF transmission system stored in memory and executed by processor of channel power meter of RF power metering system having RF power sensor in accordance with an exemplary embodiment of the invention.

FIG. 26 is a flowchart of a program 1400 for calculating VSWR stored in memory 725 and executed by processor 722 of channel power meter 720 in an exemplary embodiment of RF power metering system 800.

In block 1405, a measured post-combiner forward RF power level for the combined channel transmission line 830 is received by processor 722 and stored in memory 725. In some embodiments, the measured post-combiner forward RF power level for the combined channel transmission line 830 is measured by and received from the output power sensor 835. In an exemplary embodiment, output power sensor 835 can be RF power sensor 100.

In block 1410, a measured post-combiner reflected RF power level for the combined channel transmission line 830 is received by processor 722 and stored in memory 725. In some embodiments, the measured post-combiner reflected RF power level for the combined channel transmission line 830 is measured by and received from the output power sensor 835.

In block 1415, the VSWR level on the combined channel transmission line 830 is determined by processor 722 by retrieving the measured post-combiner forward RF power level and the measured post-combiner reflected RF power level from memory 725, calculating the VSWR level using equation 1 shown above, and storing the VSWR level in memory 725.

In block 1420, the VSWR level on the combined channel transmission line 830 is retrieved from memory 725 by processor 722 and outputted to the user. Processor 722 can output the VSWR level to a user by utilizing user I/O 726. In an exemplary embodiment, processor 722 can output for display, the VSWR level on the combined channel transmission line 830 to a user by utilizing display 724 of user I/O 726.

While this invention has been described in conjunction with the specific embodiments described above, it is evident that many alternatives, combinations, modifications and variations are apparent to those skilled in the art. Accordingly, the preferred embodiments of this invention, as set forth above are intended to be illustrative only, and not in a limiting sense. Various changes can be made without departing from the spirit and scope of this invention. Combinations of the above embodiments and other embodiments will be apparent to those of skill in the art upon studying the above description and are intended to be embraced therein. Therefore, the scope of the present invention is defined by the appended claims, and all devices, processes, and methods that come within the meaning of the claims, either literally or by equivalence, are intended to be embraced therein.

The invention claimed is:

1. A directional coupler, comprising:
   a coupler, a forward resistive attenuator, a reflected resistive attenuator, a forward compensation capacitor, and a reflected compensation capacitor;
   said coupler is comprised of a coupler transmission line section and a coupling structure;
   said coupling structure has a coupled line with a coupling length of D1, said coupling structure also has a forward coupler side arm electrically connected to an upstream end of said coupled line, and a reflected coupler side arm electrically connected to a downstream end of said coupled line;
   said coupling structure is a microstrip on a printed circuit board (PCB);
   said coupled line is coupled to said coupler transmission line section;
   said coupler transmission line section is a rigid air coaxial transmission line electrically connected to an upstream connector and a downstream connector;
   said upstream connector and said downstream connector are mounted on an outer conductor;
   said outer conductor is mounted to said PCB;
   said forward coupler side arm is configured to obtain a sample of forward energy from said coupler transmission line section using said coupled line, and said reflected coupler side arm is configured to obtain a sample of reflected energy from said coupled transmission line section using said coupled line;
   said forward coupler side arm is electrically connected to said forward resistive attenuator and configured to provide said sample of forward energy to said forward resistive attenuator;
   said forward resistive attenuator is configured to attenuate said sample of forward energy, thereby producing an attenuated sample of forward energy, said forward resistive attenuator is electrically connected to said forward compensation capacitor and configured to provide said attenuated sample of forward energy to said forward compensation capacitor;
   said forward compensation capacitor is configured to receive said attenuated sample of forward energy and produce a frequency-compensated sample of forward energy;
   said reflected coupler side arm is electrically connected to said reflected resistive attenuator and configured to provide said sample of reflected energy to said reflected resistive attenuator;
   said reflected resistive attenuator is configured to attenuate said sample of reflected energy, thereby producing an attenuated sample of reflected energy, said reflected resistive attenuator is electrically connected to said reflected compensation capacitor and configured to provide said attenuated sample of reflected energy to said reflected compensation capacitor; and
   said reflected compensation capacitor is configured to receive said attenuated sample of reflected energy and produce a frequency-compensated sample of reflected energy.

2. The directional coupler as set forth in claim 1, wherein said directional coupler is configured as a frequency-compensated shortline dual directional coupler.

3. The directional coupler as set forth in claim 1, wherein said coupling length (D1) of said coupled line is less than $\lambda/4$, where $\lambda$ is a wavelength of an RF wave in said coupled line at a center frequency of said directional coupler.

4. The directional coupler as set forth in claim 1, wherein said coupling length (D1) of said coupled line is between $\lambda/32$ and $\lambda/64$.

5. The directional coupler as set forth in claim 4, wherein said coupling length (D1) of said coupled line is $\lambda/42$.

6. The directional coupler as set forth in claim 1, wherein said forward compensation capacitor is configured as:
   a shunt capacitor,
   a feedthru shunt capacitor,
   a capacitive divider having a series capacitor and said shunt capacitor,
   said capacitive divider having said series capacitor and said feedthru shunt capacitor, or
   said capacitive divider having a first shunt capacitor and said series capacitor and a second shunt capacitor, wherein said second shunt capacitor is said feedthru shunt capacitor.

7. The directional coupler as set forth in claim 1, wherein said reflected compensation capacitor is configured as:
   a shunt capacitor,
   a feedthru shunt capacitor,
   a capacitive divider having a series capacitor and said shunt capacitor,
   said capacitive divider having said series capacitor and said feedthru shunt capacitor, or
   said capacitive divider having a first shunt capacitor and said series capacitor and a second shunt capacitor, wherein said second shunt capacitor is said feedthru shunt capacitor.

8. The directional coupler as set forth in claim 1, wherein:
   said forward resistive attenuator is comprised of a first chip attenuator and said reflected attenuator is comprised of a second chip attenuator, or
   said forward resistive attenuator is comprised of said first chip attenuator and a first lumped attenuator, and said reflected attenuator is comprised of said second chip attenuator and a second lumped attenuator.

9. The directional coupler as set forth in claim 1, wherein:
   said forward compensation capacitor and said reflected compensation capacitor are configured to:
   reduce the coupling of said coupled line to said coupler transmission line section, thereby flattening a frequency response of said directional coupler, and/or
   reduce a level of said frequency-compensated sample of forward energy and a level of said frequency-compensated sample of reflected energy through voltage division and reduce an impedance seen by a forward square-law detector and a reflected square-law detector;
   and/or
      said forward resistive attenuator provides isolation between said forward compensation capacitor and said coupling structure, and said reflected resistive attenuator provides isolation between said reflected compensation capacitor and said coupling structure, thereby preventing said forward compensation capacitor and said reflected compensation capacitor from degrading a directivity of said coupler structure.

10. A radio frequency (RF) power sensor comprising:
a directional coupler and a power measurement circuit;
said directional coupler is configured to sample energy on a main transmission line and provides a frequency-compensated sample of forward energy and a frequency-compensated sample of reflected energy to said power measurement circuit;
said frequency-compensated sample of forward energy is a sample of energy travelling in the forward direction on said main transmission line, and said frequency-compensated sample of reflected energy is a sample of energy travelling in the reflected direction on said main transmission line;
said power measurement circuit is configured to receive said frequency-compensated sample of forward energy and said frequency-compensated sample of reflected energy and output a corrected digitized forward power that is representative of the forward energy travelling on said main transmission line, and a corrected digitized reflected power which is representative of the reflected energy travelling on said main transmission line;
said directional coupler comprises a coupler, a forward resistive attenuator, a reflected resistive attenuator, a forward compensation capacitor, and a reflected compensation capacitor;
said coupler is comprised of a coupler transmission line section and a coupling structure;
said coupling structure has a coupled line with a coupling length of D1, said coupling structure also has a forward coupler side arm electrically connected to an upstream end of said coupled line, and a reflected coupler side arm electrically connected to a downstream end of said coupled line;
said coupling structure is a microstrip on a printed circuit board (PCB);
said coupled line is coupled to said coupler transmission line section;
said coupler transmission line section is a rigid air coaxial transmission line;
said forward coupler side arm is configured to obtain a sample of forward energy from said coupler transmission line section using said coupled line, and said reflected coupler side arm is configured to obtain a sample of reflected energy from said coupled transmission line section using said coupled line;
said forward coupler side arm is electrically connected to said forward resistive attenuator and configured to provide said sample of forward energy to said forward resistive attenuator;
said forward resistive attenuator is configured to attenuate said sample of forward energy, thereby producing an attenuated sample of forward energy, said forward resistive attenuator is electrically connected to said forward compensation capacitor and configured to provide said attenuated sample of forward energy to said forward compensation capacitor;
said forward compensation capacitor is configured to receive said attenuated sample of forward energy and produce a frequency-compensated sample of forward energy;
said reflected coupler side arm is electrically connected to said reflected resistive attenuator and configured to provide said sample of reflected energy to said reflected resistive attenuator;
said reflected resistive attenuator is configured to attenuate said sample of reflected energy, thereby producing an attenuated sample of reflected energy, said reflected resistive attenuator is electrically connected to said reflected compensation capacitor and configured to provide said attenuated sample of reflected energy to said reflected compensation capacitor; and
said reflected compensation capacitor is configured to receive said attenuated sample of reflected energy and produce a frequency-compensated sample of reflected energy.

11. The RF power sensor as set forth in claim 10, wherein said directional coupler is configured as a frequency-compensated shortline dual directional coupler.

12. The RF power sensor as set forth in claim 10, wherein said coupling length (D1) of said coupled line is less than $\lambda/4$, where $\lambda$ is a wavelength of an RF wave in said coupled line at a center frequency of said directional coupler.

13. The RF power sensor as set forth in claim 10, wherein said coupling length (D1) of said coupled line is between $\lambda/32$ and $\lambda/64$.

14. The RF power sensor as set forth in claim 13, wherein said coupling length (D1) of said coupled line is $\lambda/42$.

15. The RF power sensor as set forth in claim 10, wherein said forward compensation capacitor is configured as:
a shunt capacitor,
a feedthru shunt capacitor,
a capacitive divider having a series capacitor and said shunt capacitor,
said capacitive divider having said series capacitor and said feedthru shunt capacitor, or
said capacitive divider having a first shunt capacitor and said series capacitor and a second shunt capacitor, wherein said second shunt capacitor is said feedthru shunt capacitor.

16. The RF power sensor as set forth in claim 10, wherein said reflected compensation capacitor is configured as:
a shunt capacitor,
a feedthru shunt capacitor,
a capacitive divider having a series capacitor and said shunt capacitor,
said capacitive divider having said series capacitor and said feedthru shunt capacitor, or
said capacitive divider having a first shunt capacitor and said series capacitor and a second shunt capacitor, wherein said second shunt capacitor is said feedthru shunt capacitor.

17. The RF power sensor as set forth in claim 10, wherein:
said forward resistive attenuator is comprised of a first chip attenuator and said reflected attenuator is comprised of a second chip attenuator, or
said forward resistive attenuator is comprised of said first chip attenuator and a first lumped attenuator, and said reflected attenuator is comprised of said second chip attenuator and a second lumped attenuator.

18. The RF power sensor as set forth in claim 10, wherein:
said forward compensation capacitor and said reflected compensation capacitor are configured to:
reduce the coupling of said coupled line to said coupler transmission line section, thereby flattening a frequency response of said directional coupler, and/or
reduce a level of said frequency-compensated sample of forward energy and a level of said frequency-compensated sample of reflected energy through voltage division and reduce an impedance seen by a forward square-law detector and a reflected square-law detector;

and/or said forward resistive attenuator provides isolation between said forward compensation capacitor and said coupling structure, and said reflected resistive attenuator provides isolation between said reflected compensation capacitor and said coupling structure, thereby preventing said forward compensation capacitor and said reflected compensation capacitor from degrading a directivity of said coupler structure.

* * * * *